United States Patent
Pyo

(10) Patent No.: US 12,412,489 B2
(45) Date of Patent: Sep. 9, 2025

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 391 days.

(21) Appl. No.: 17/909,087

(22) PCT Filed: Mar. 3, 2020

(86) PCT No.: PCT/KR2020/003014
§ 371 (c)(1),
(2) Date: Sep. 2, 2022

(87) PCT Pub. No.: WO2021/177481
PCT Pub. Date: Sep. 10, 2021

(65) Prior Publication Data
US 2023/0109437 A1    Apr. 6, 2023

(51) Int. Cl.
*G09F 9/30* (2006.01)
*H05K 5/02* (2006.01)
*H10K 99/00* (2023.01)

(52) U.S. Cl.
CPC ........... *G09F 9/301* (2013.01); *H05K 5/0217* (2013.01); *H10K 99/00* (2023.02)

(58) Field of Classification Search
CPC .. H05K 5/0217; B65H 75/28; B65H 75/4471; B65H 75/4486; G06F 1/1601; G06F 1/1652; G09F 9/301; H10K 99/00
See application file for complete search history.

(56) References Cited

U.S. PATENT DOCUMENTS

| | | | |
|---|---|---|---|
| 9,010,887 B1 * | 4/2015 | Shao | H05K 7/1489 |
| | | | 312/319.1 |
| 9,704,521 B1 * | 7/2017 | Shah | G11B 5/54 |
| 10,410,549 B1 * | 9/2019 | Kim | G09F 9/301 |

(Continued)

FOREIGN PATENT DOCUMENTS

| KR | 10-2004-0015873 | 2/2004 |
|---|---|---|
| KR | 10-2004-0015874 | 2/2004 |

(Continued)

OTHER PUBLICATIONS

PCT International Application No. PCT/KR2020/003014, International Search Report dated Nov. 25, 2020, 4 pages.

*Primary Examiner* — Abhishek M Rathod
*Assistant Examiner* — Keon Kim
(74) *Attorney, Agent, or Firm* — LEE, HONG, DEGERMAN, KANG & WAIMEY

(57) ABSTRACT

A display device is disclosed. The display device of the present disclosure comprises: a flexible display panel; a roller that is elongated and rolls up or unrolls the display panel; a housing in which the roller is located and having an opening through which the display panel passes; and a door assembly which is coupled to the housing adjacent to the opening, and opens and closes the opening, wherein the door assembly comprises: a door for opening or closing the opening; and a suspender positioned between the housing and the door and having one end fixed to one of the housing and the door, and the other end movably coupled to the other one.

10 Claims, 33 Drawing Sheets

(56) References Cited

U.S. PATENT DOCUMENTS

| | | | |
|---|---|---|---|
| 2007/0018547 A1* | 1/2007 | Yang | A47B 88/427 |
| | | | 312/223.1 |
| 2010/0325837 A1* | 12/2010 | Lu | H04M 1/0237 |
| | | | 16/362 |
| 2012/0147463 A1 | 6/2012 | Jung et al. | |
| 2015/0382492 A1* | 12/2015 | Oneufer | H02B 13/02 |
| | | | 312/295 |

FOREIGN PATENT DOCUMENTS

| | | |
|---|---|---|
| KR | 10-2019-0111346 | 10/2019 |
| KR | 10-2020-0013549 | 2/2020 |

\* cited by examiner

[FIG. 1]
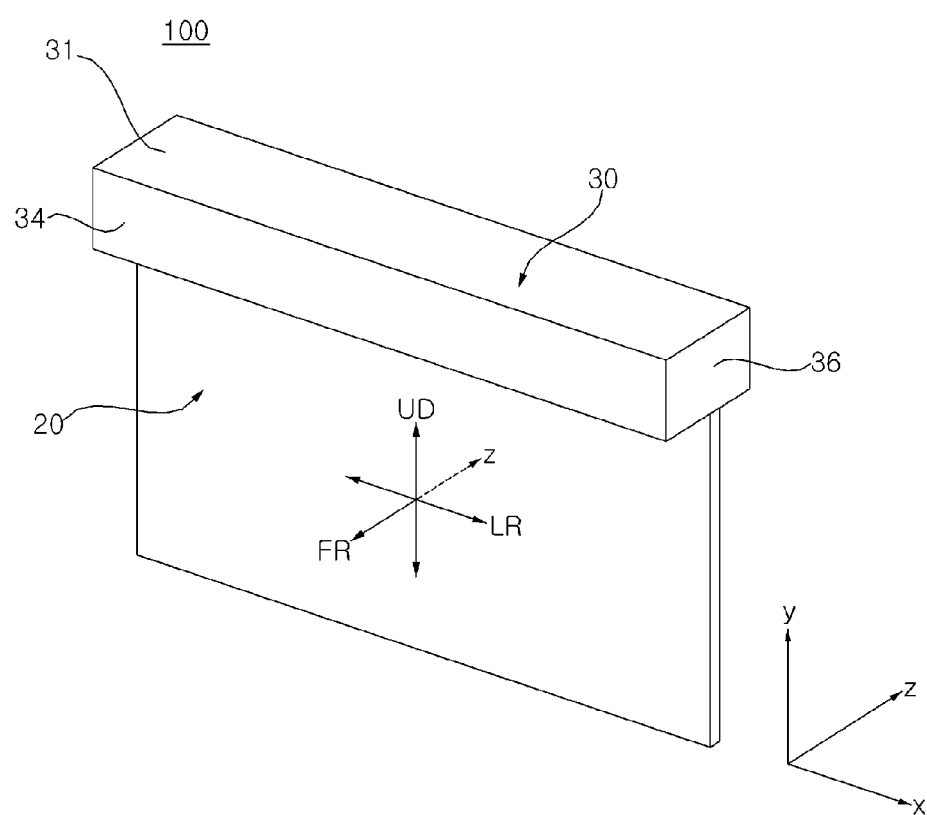

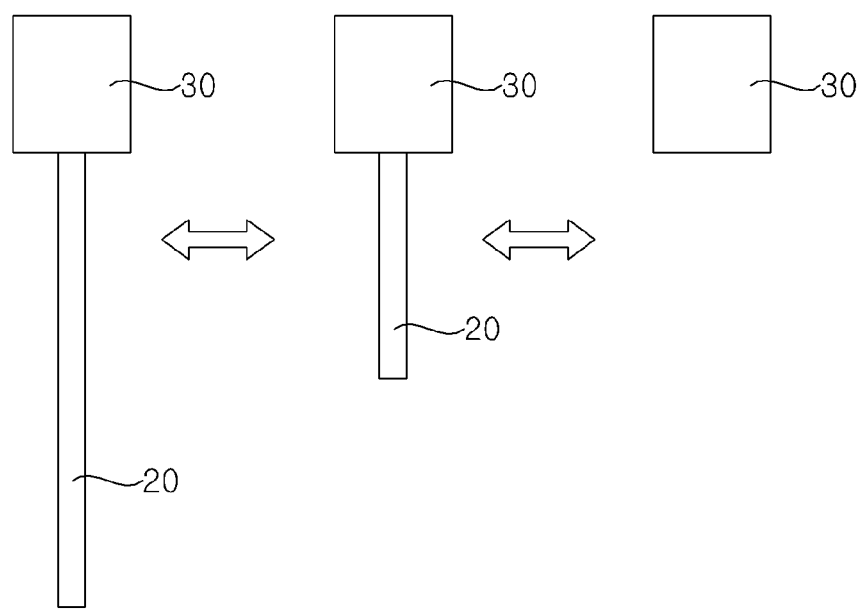

[FIG. 3]
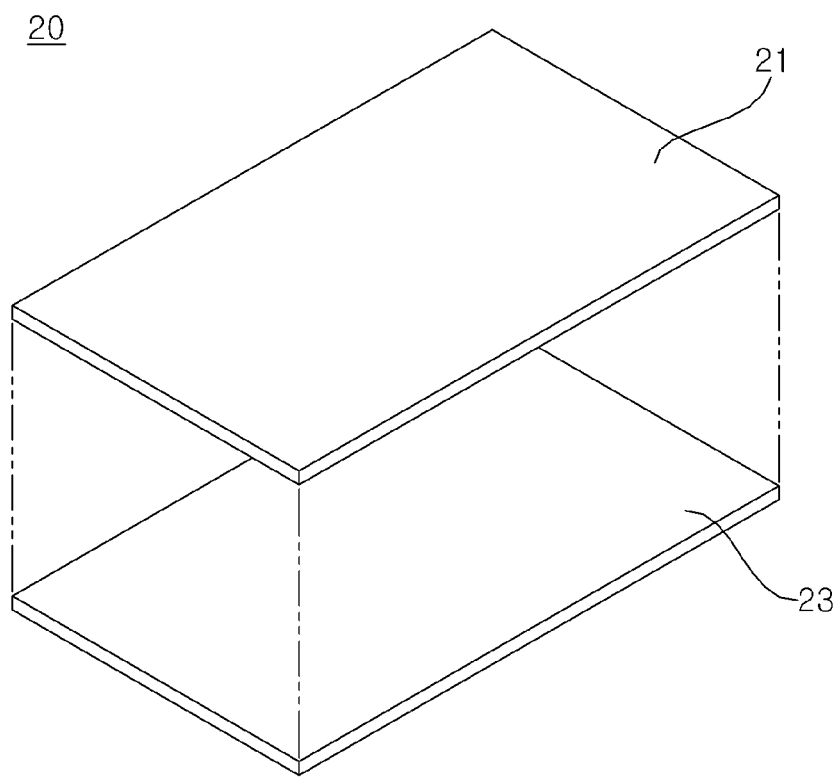

[FIG. 4]
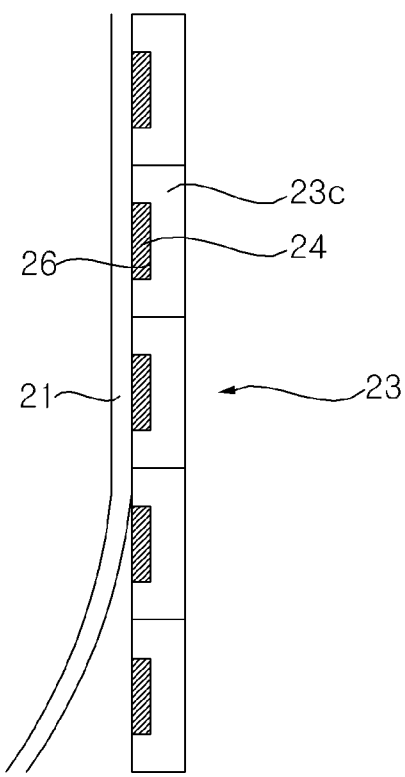

[FIG. 5]
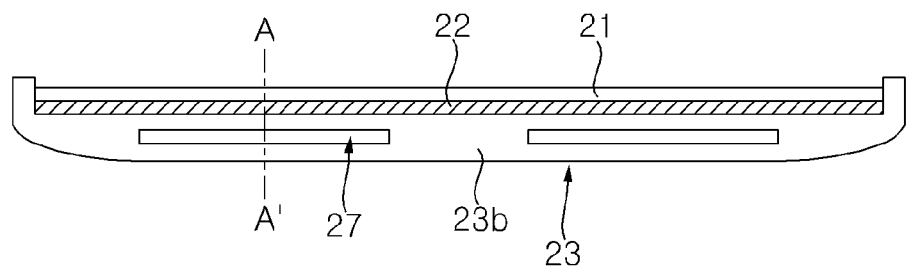
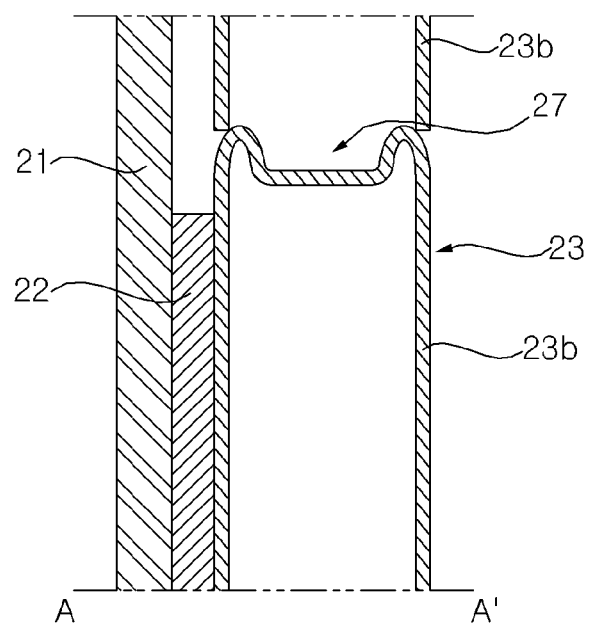

[FIG. 6]
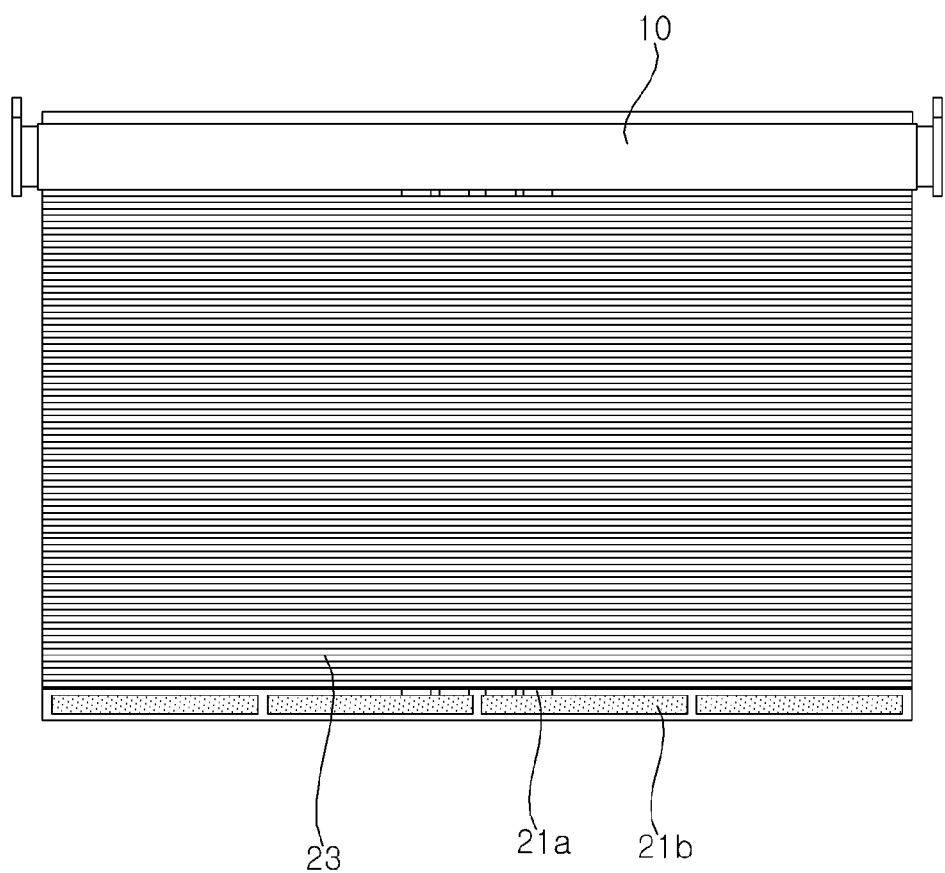

[FIG. 7]
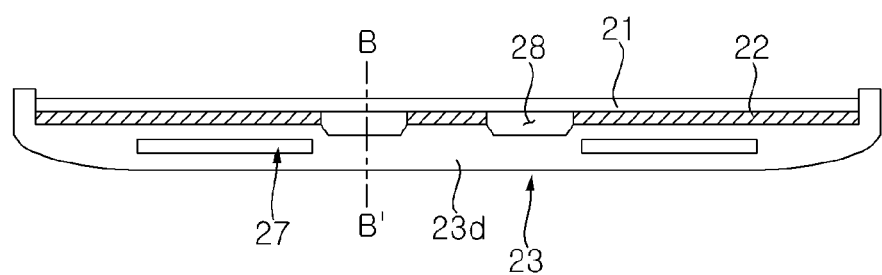
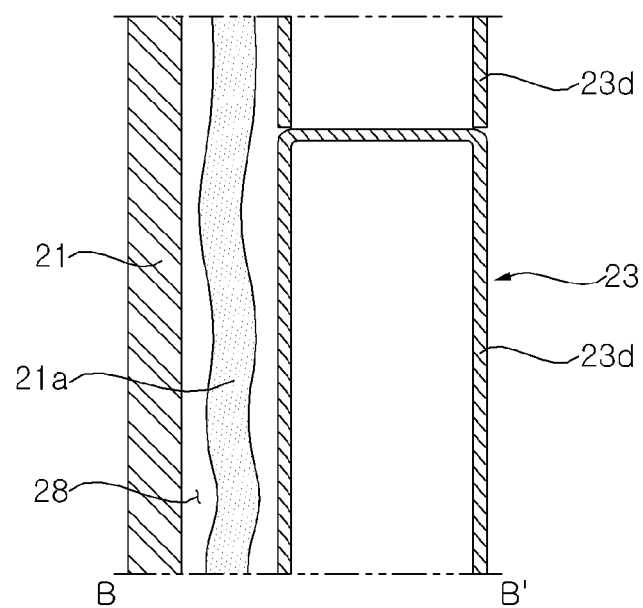

[FIG. 8]
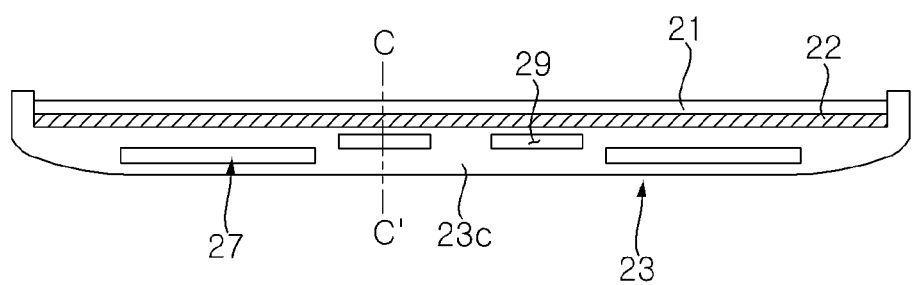
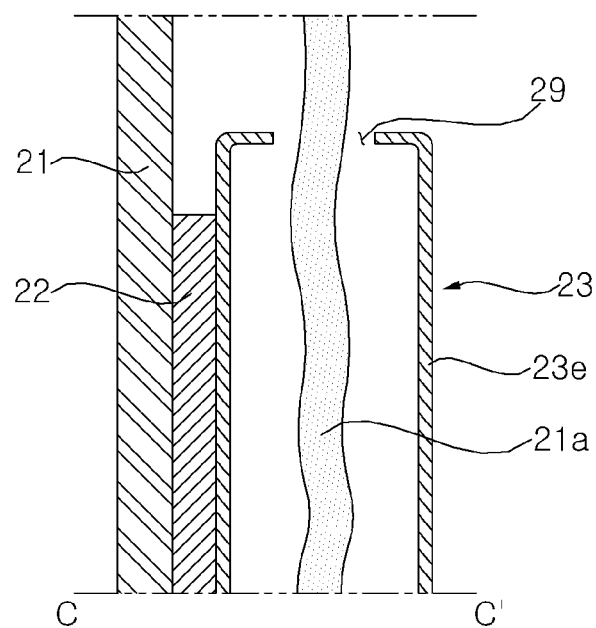

[FIG. 9]
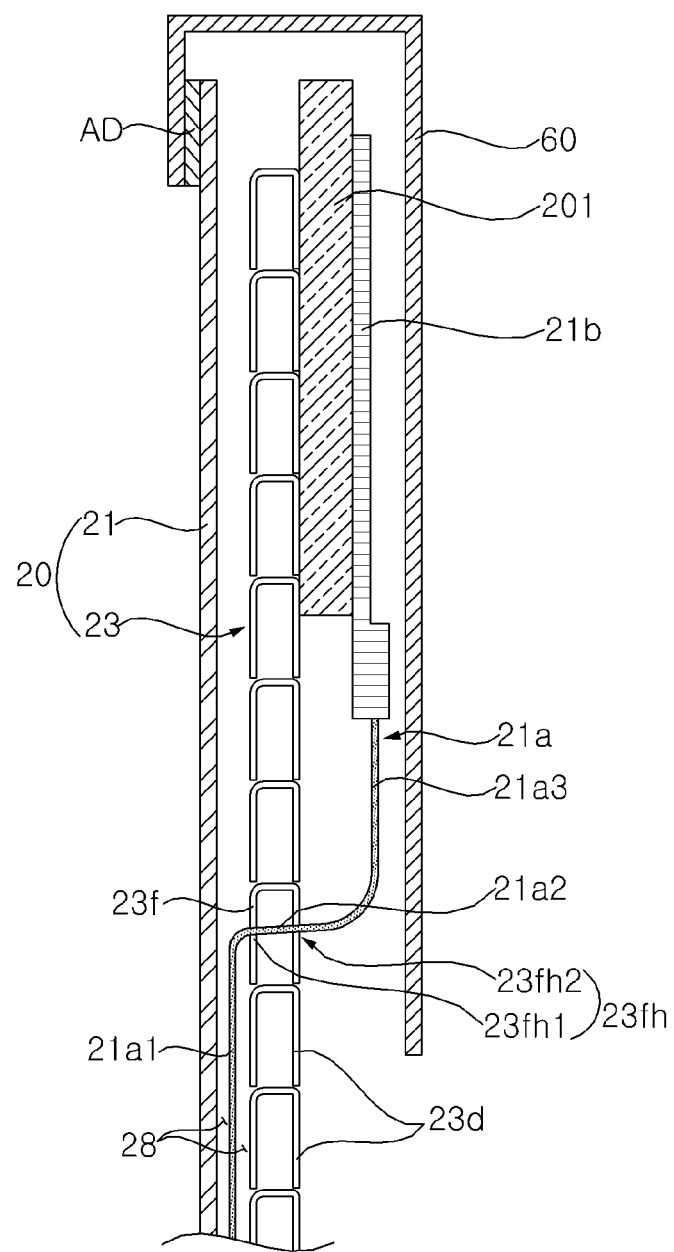

[FIG. 10]
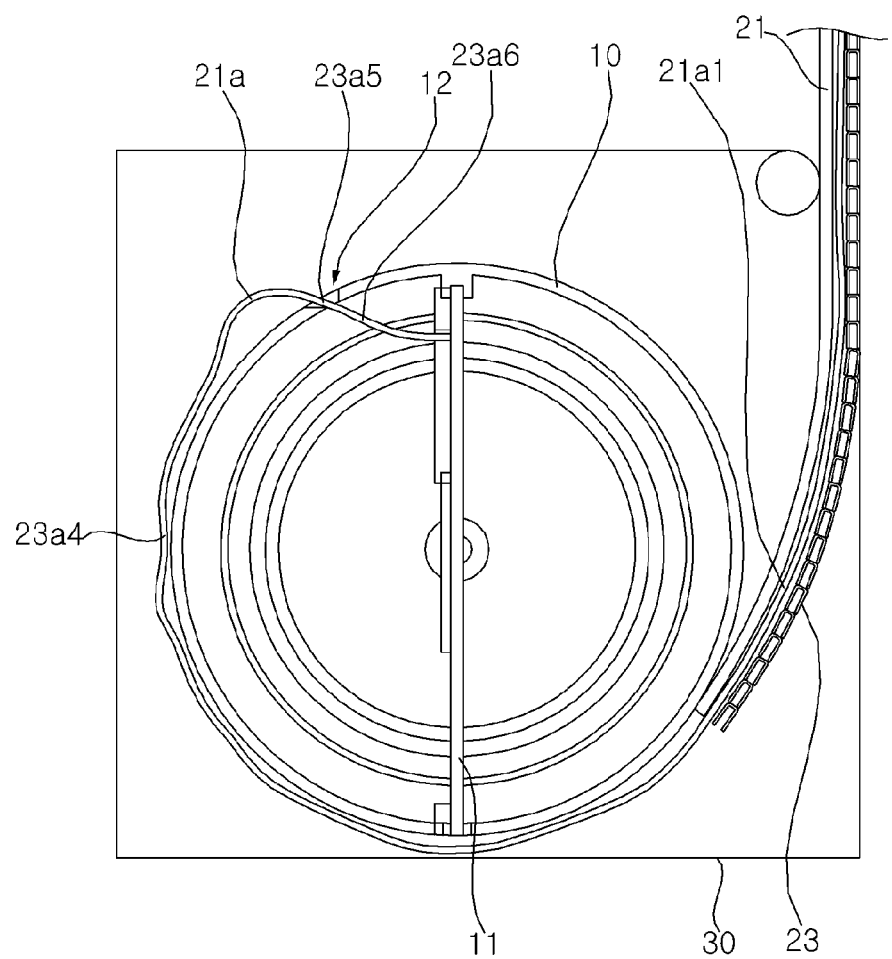

[FIG. 11]
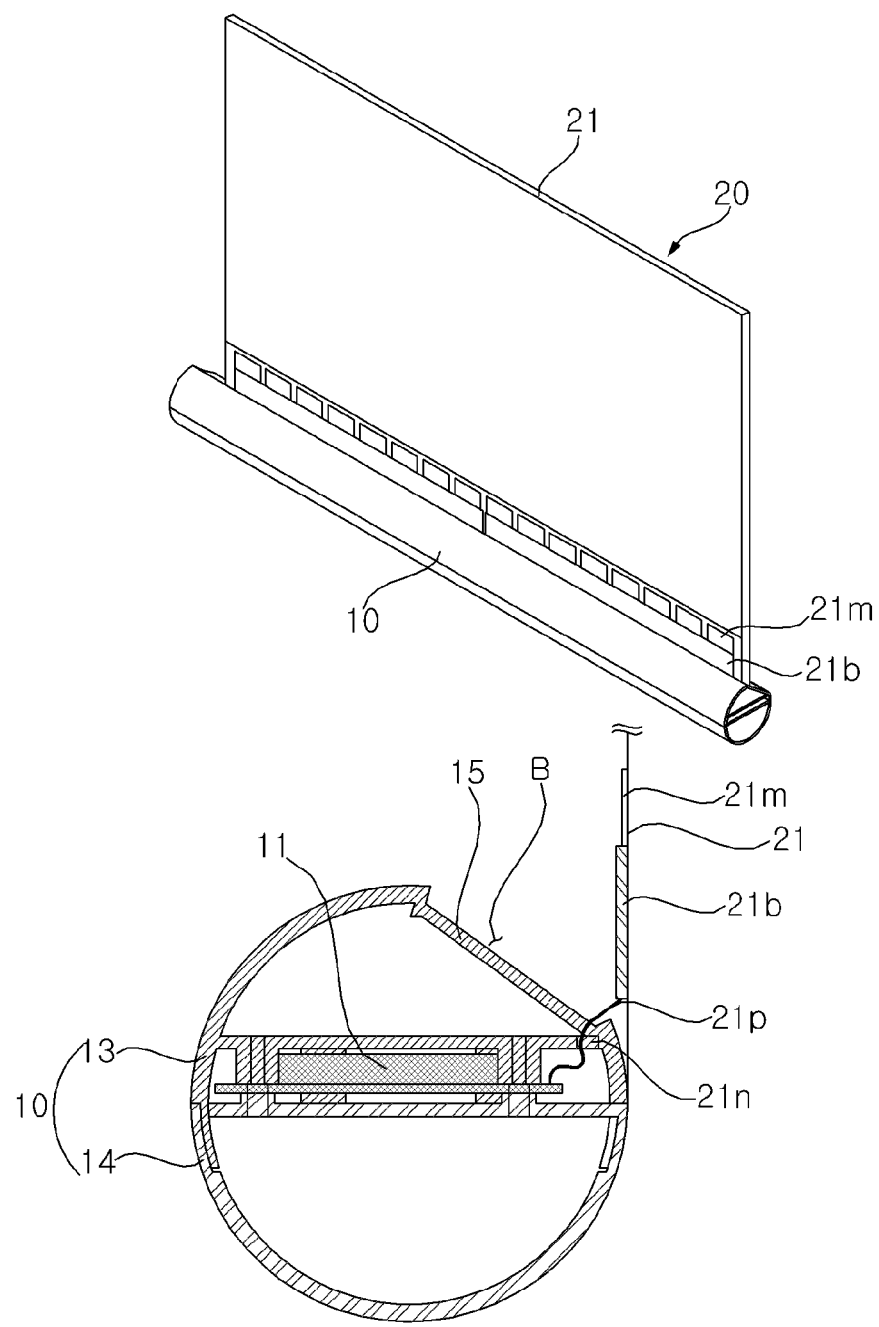

[FIG. 12]
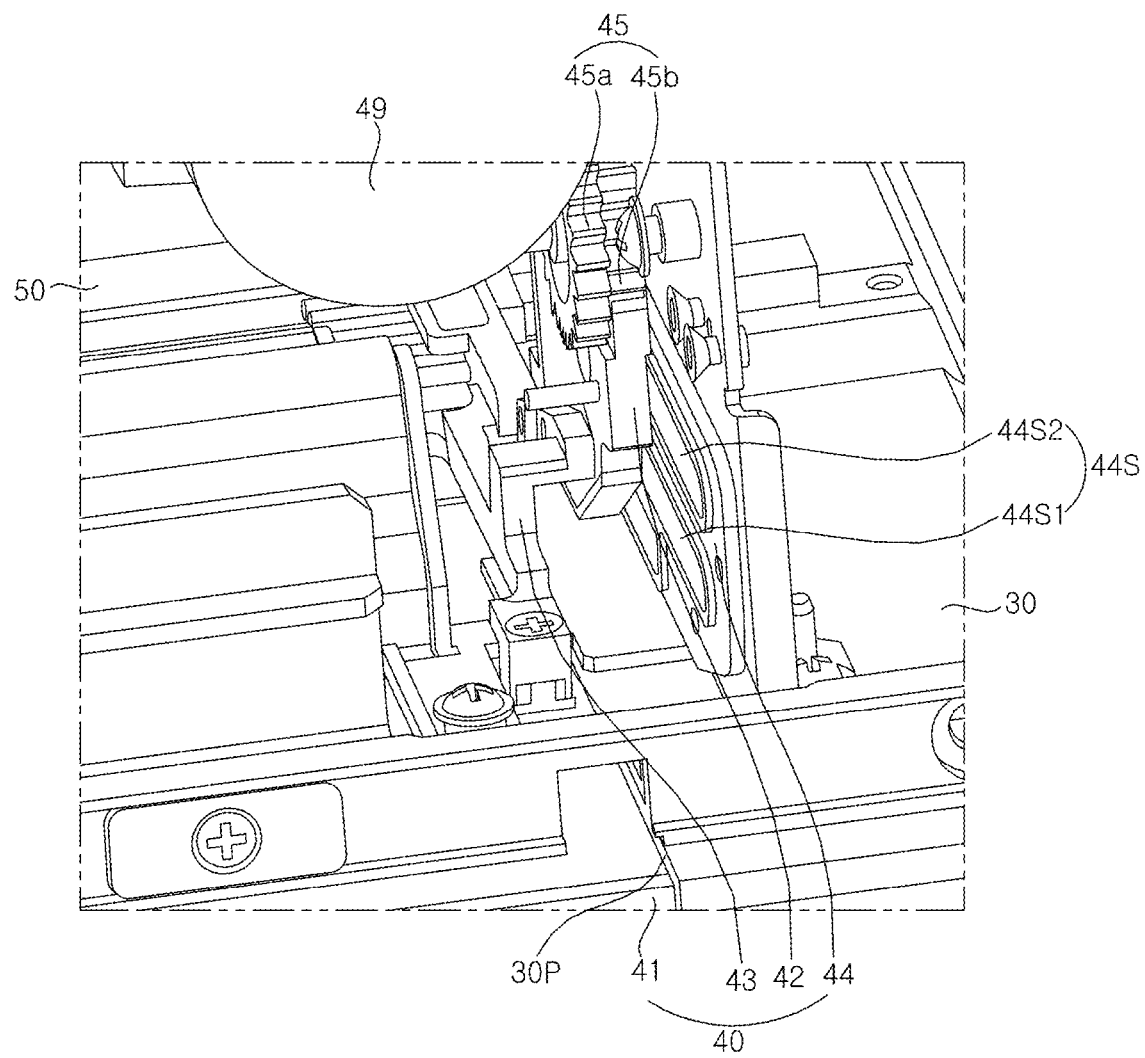

[FIG. 13]
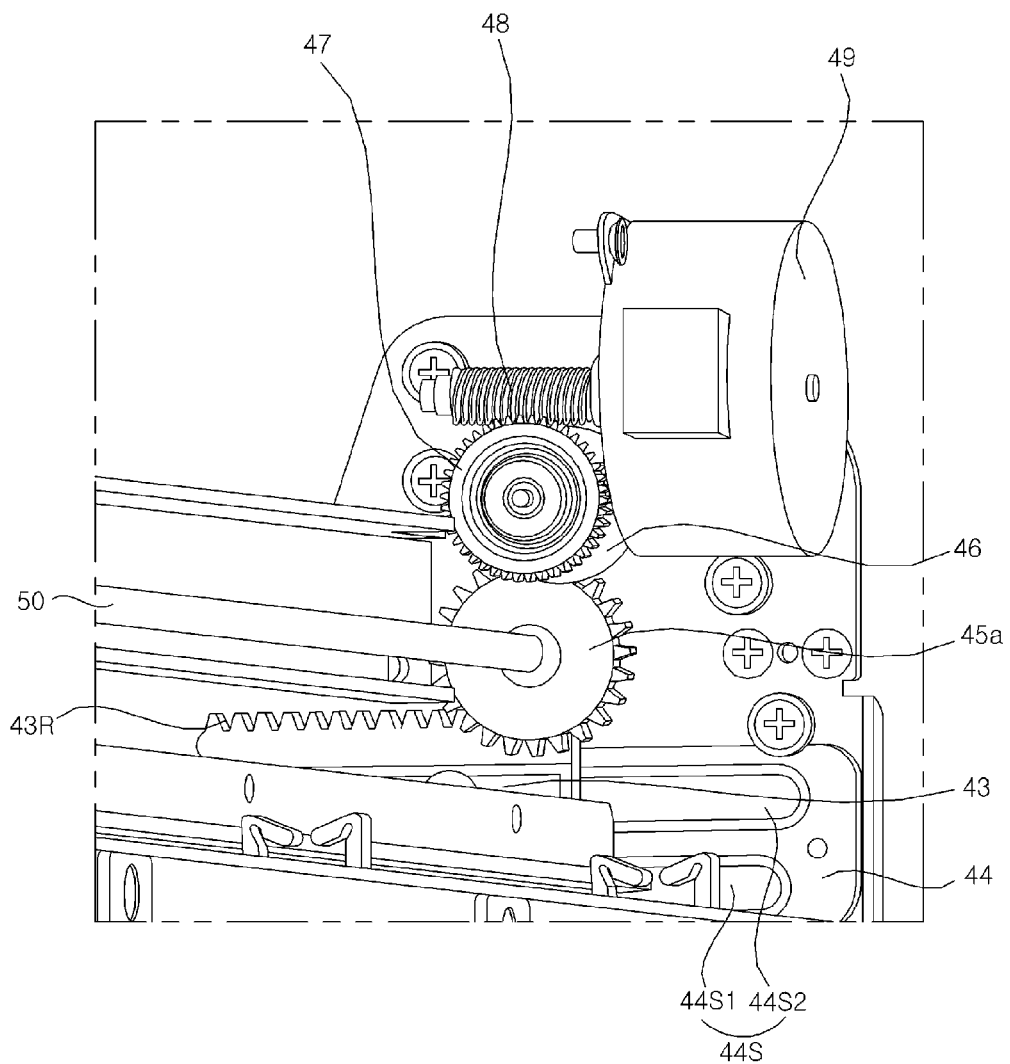

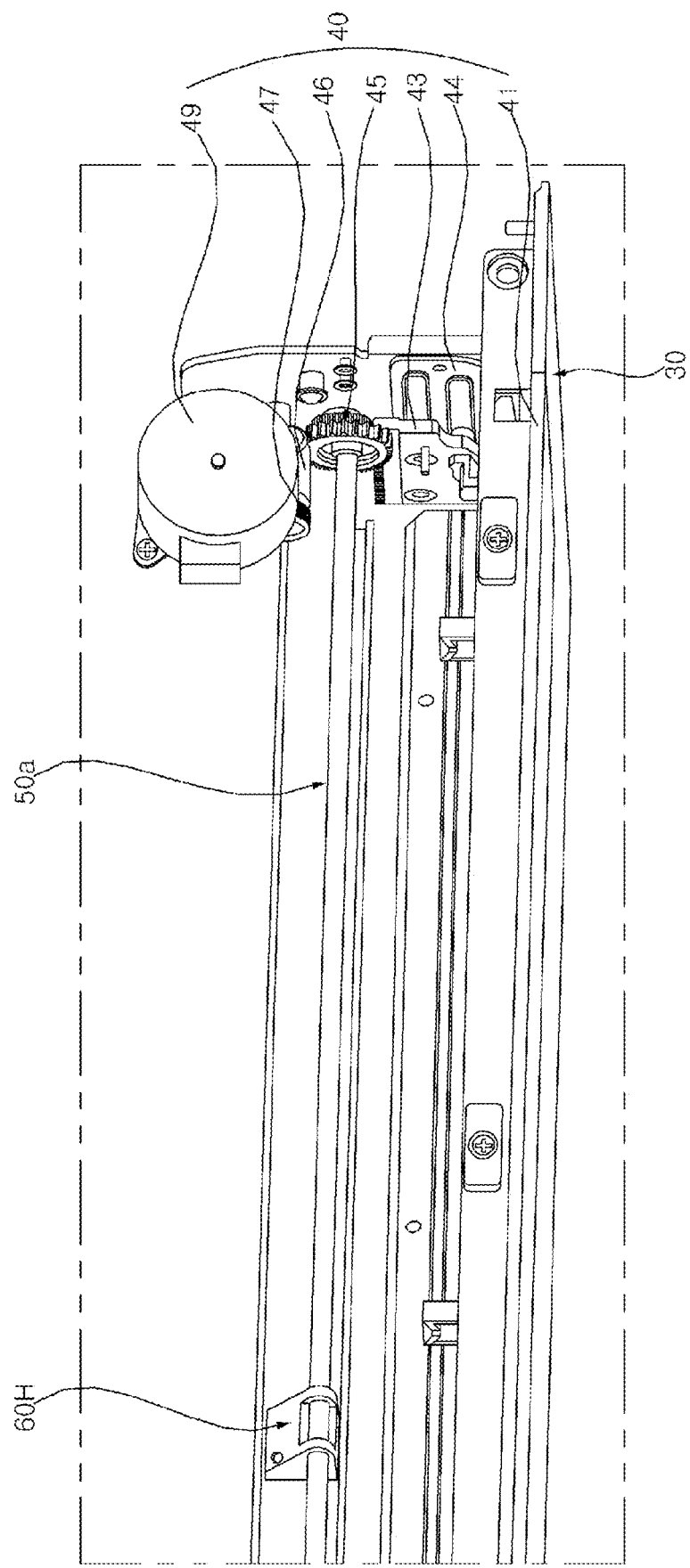
[FIG. 14]

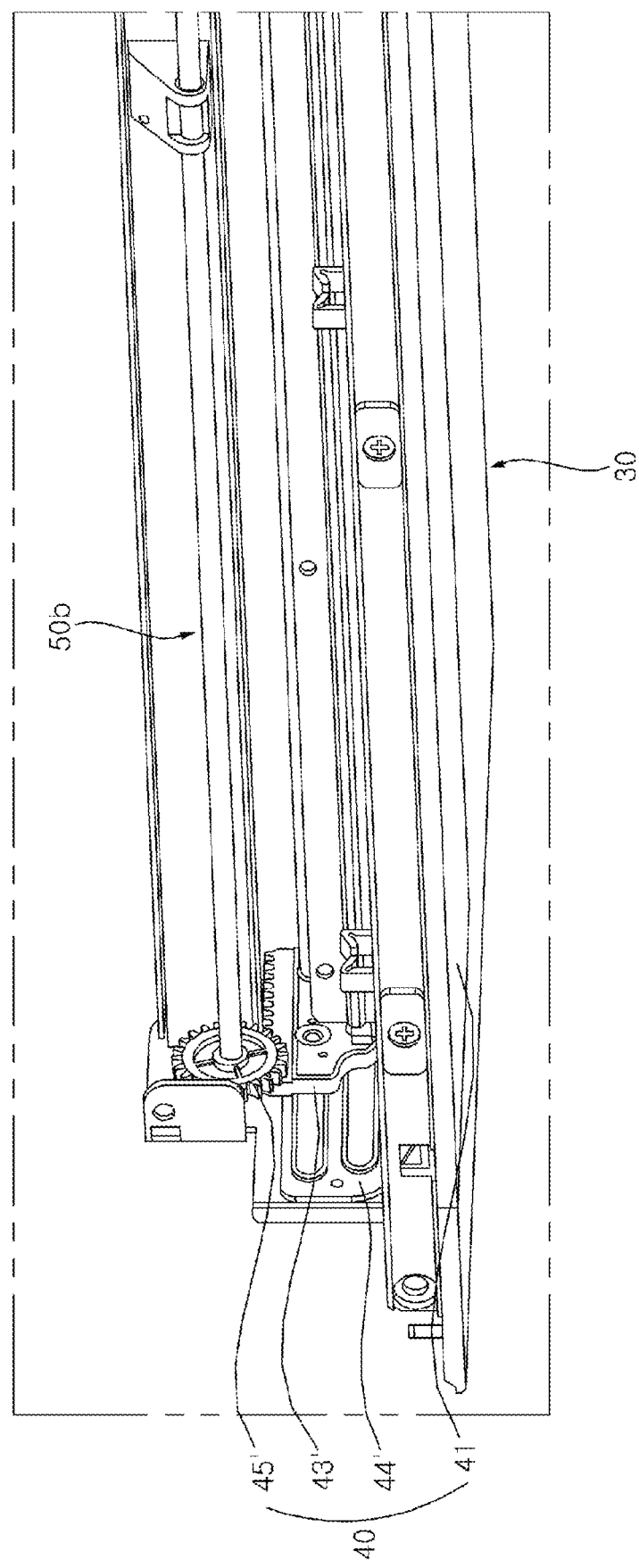
[FIG. 15]

[FIG. 16]
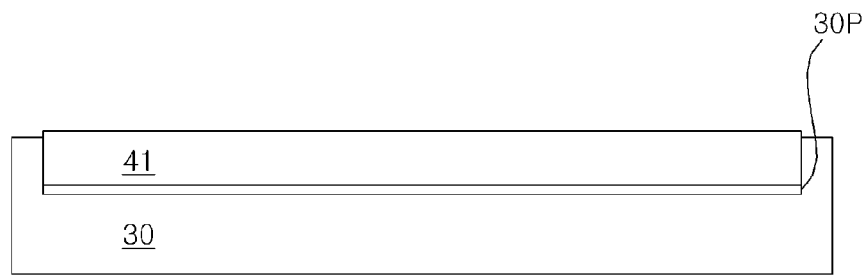

【FIG. 17】
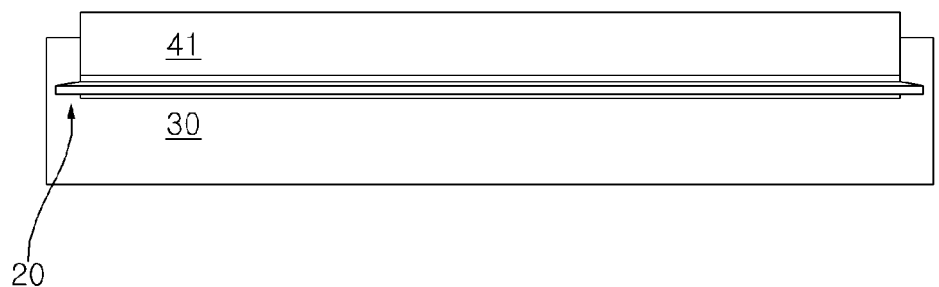

[FIG. 18]
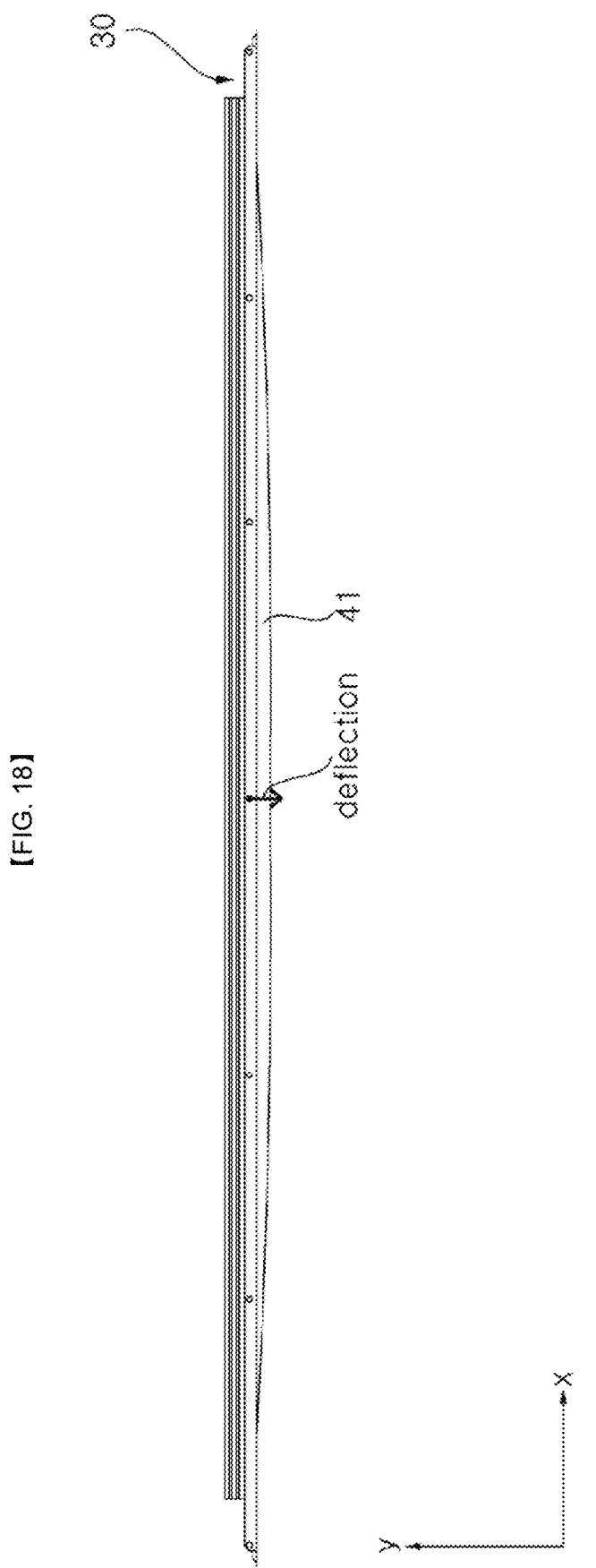

[FIG. 19]
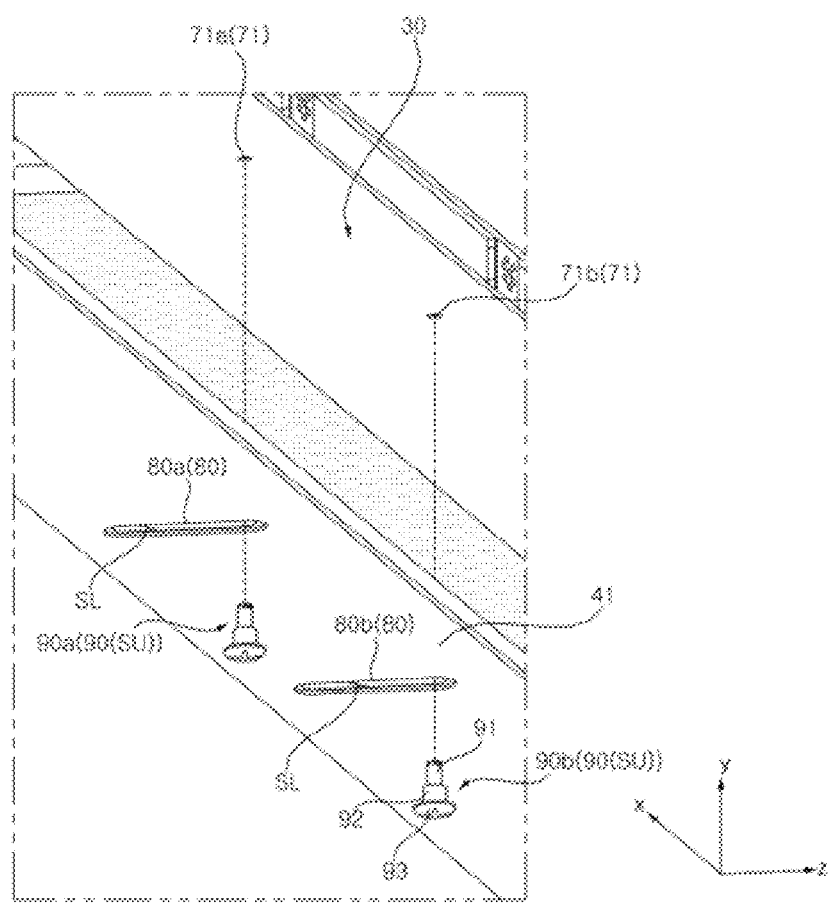

[FIG. 20]
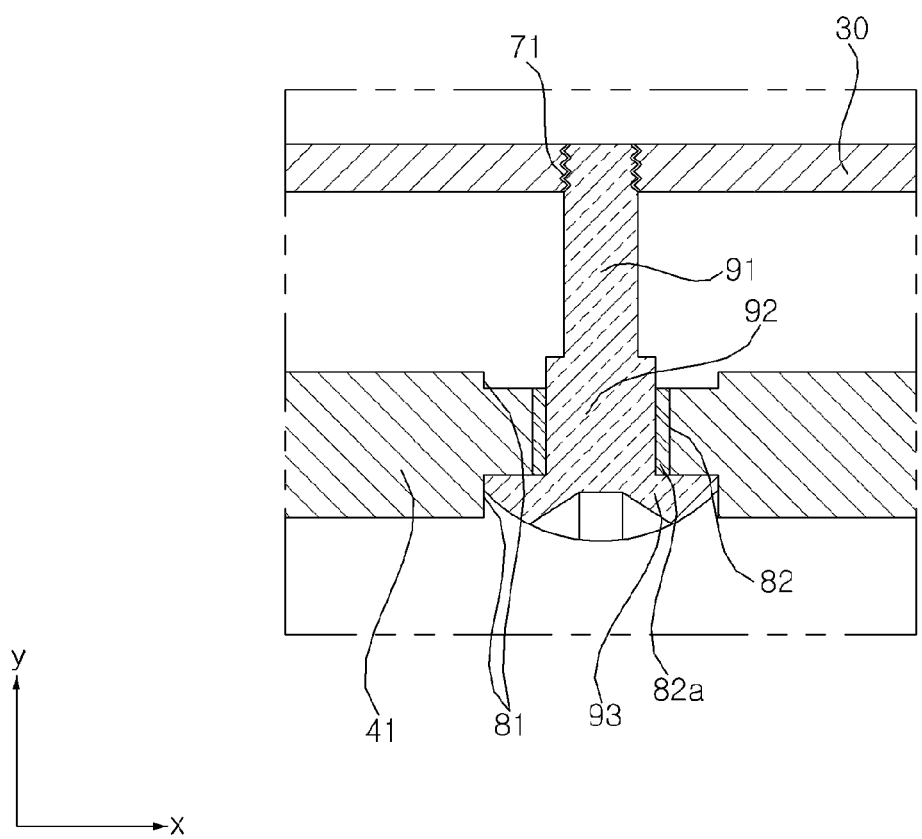

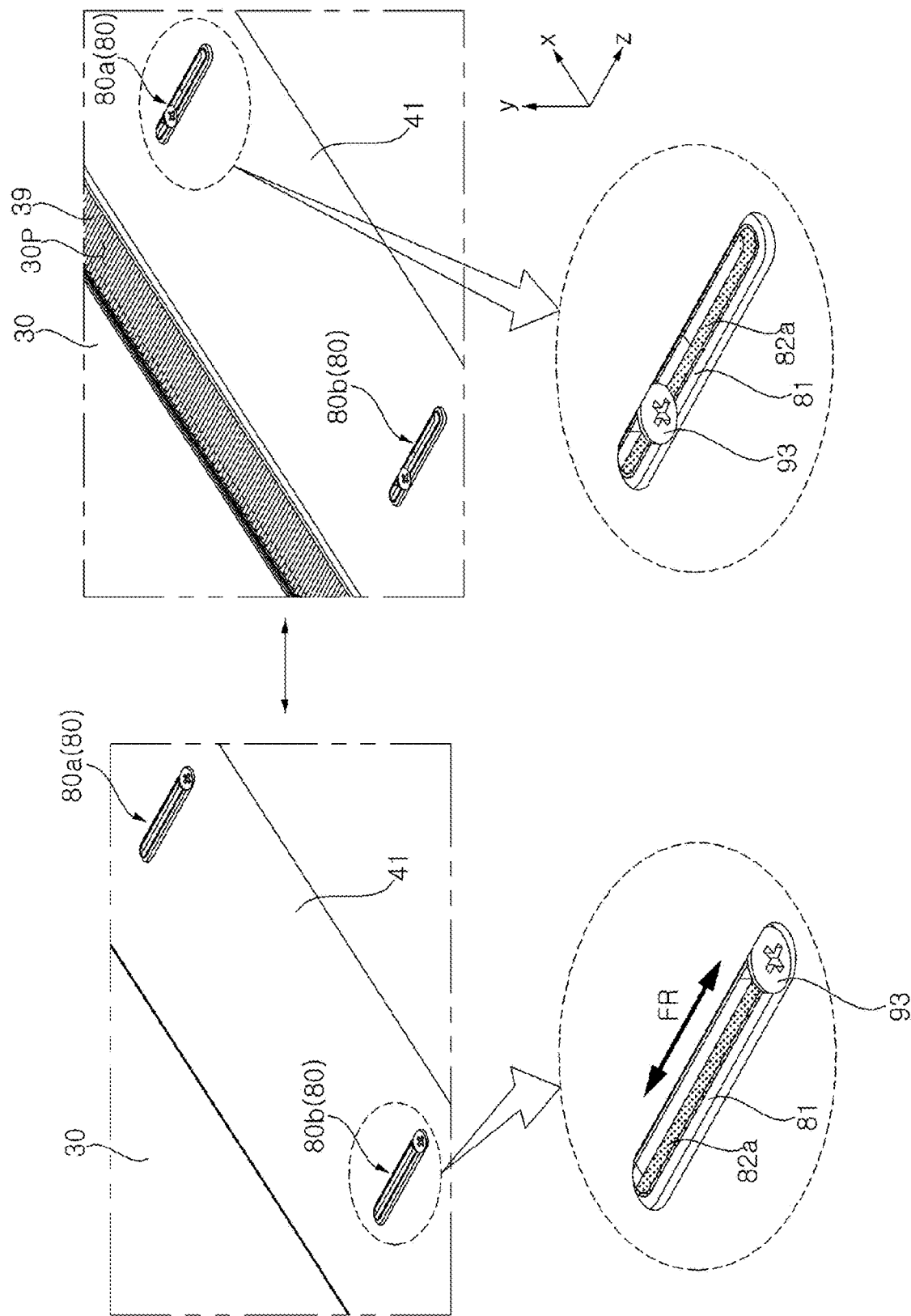
[FIG. 21]

[FIG. 22]
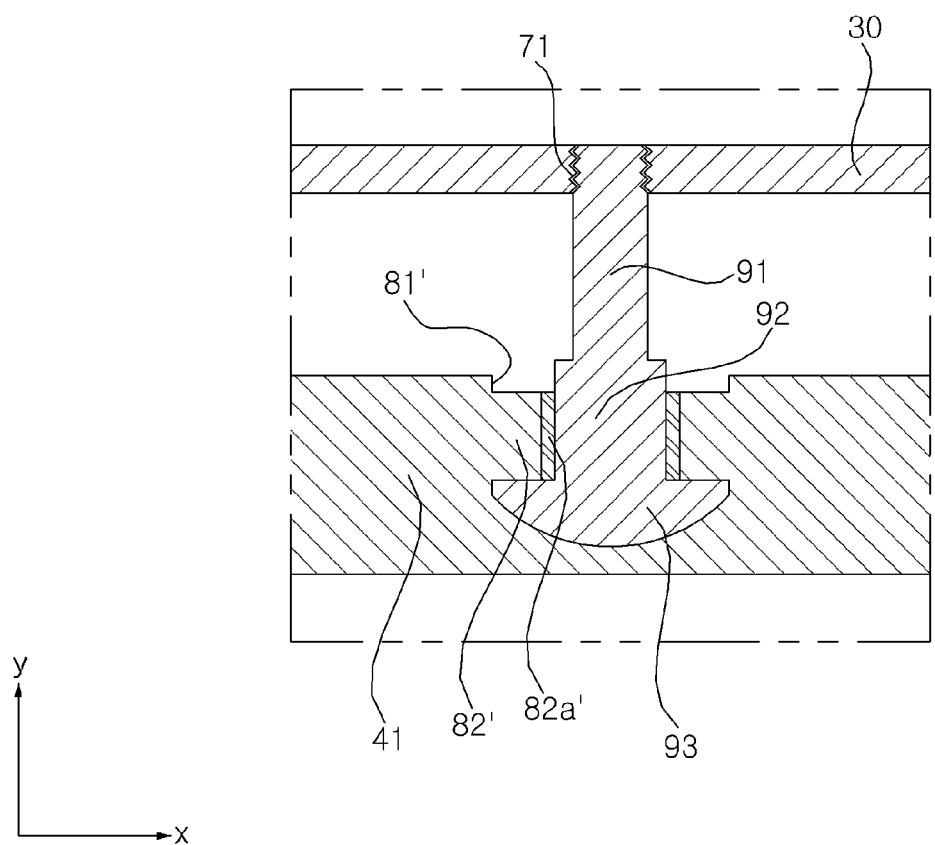

[FIG. 23]
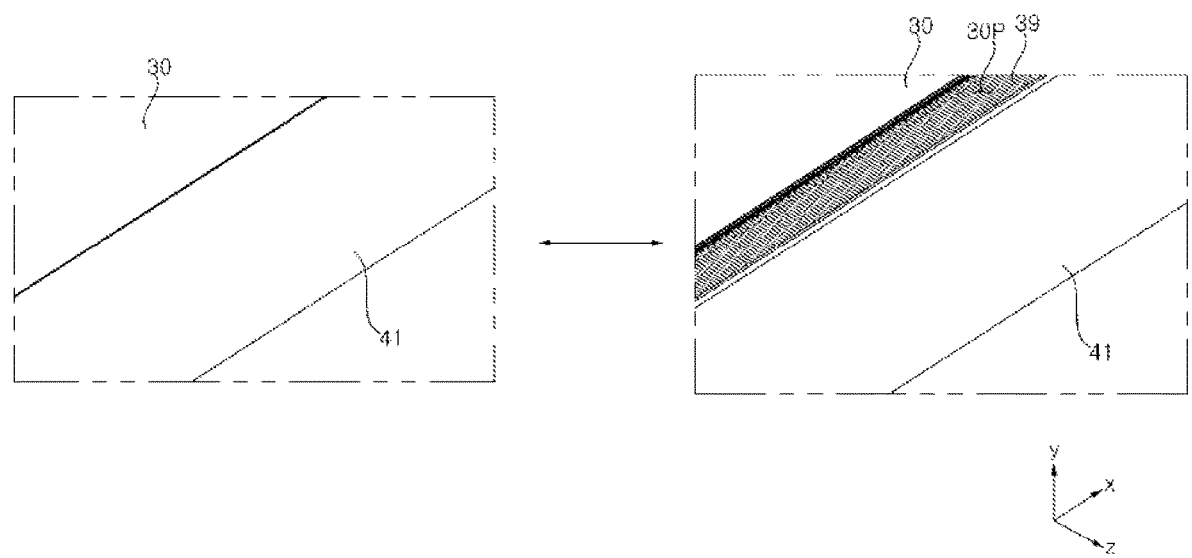

[FIG. 24]
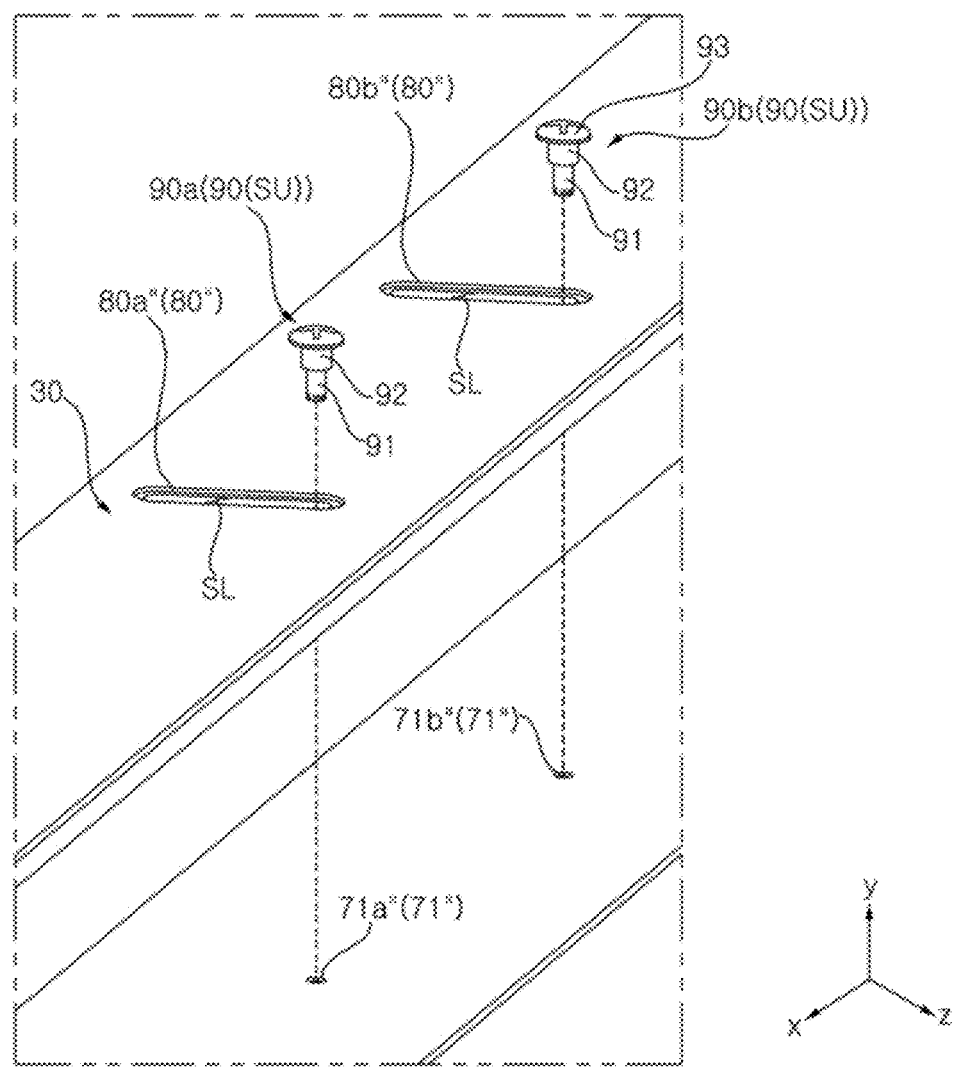

[FIG. 25]
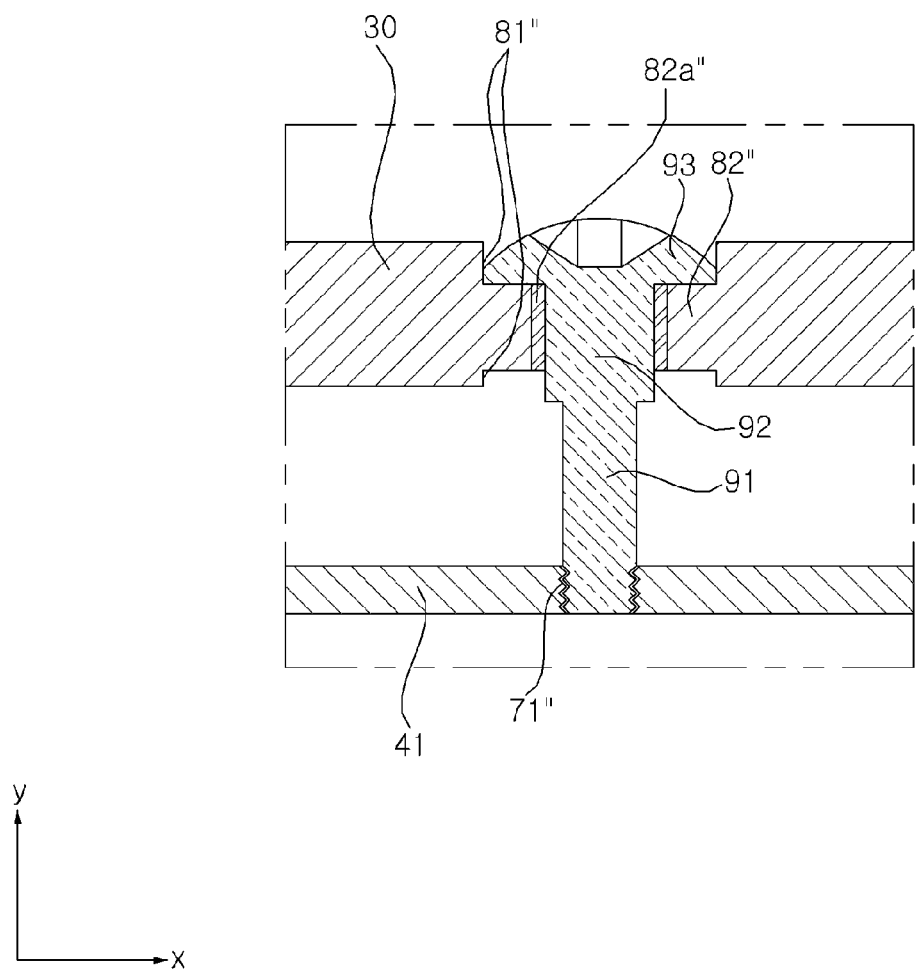

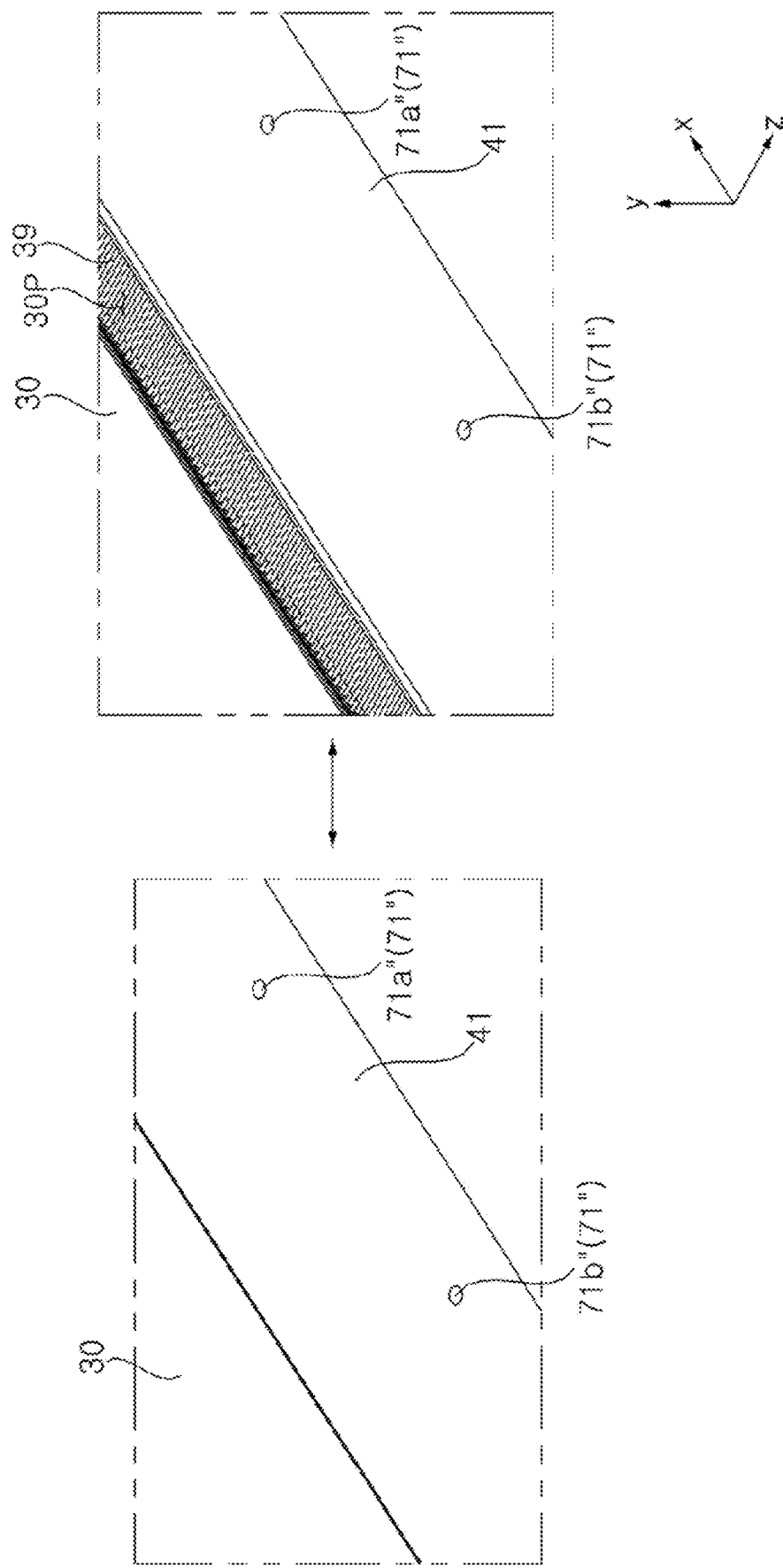

[FIG. 27]
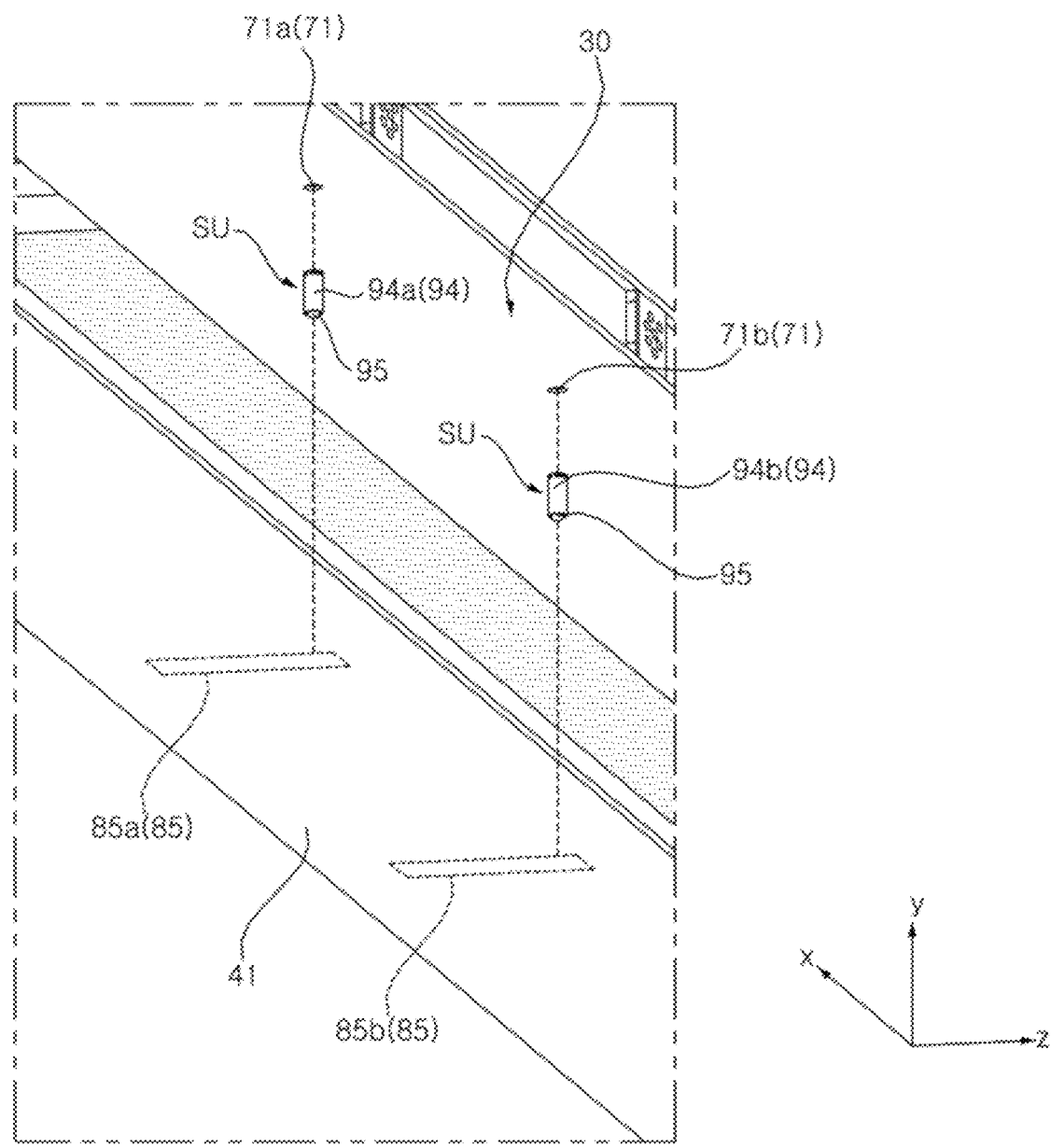

【FIG. 28】
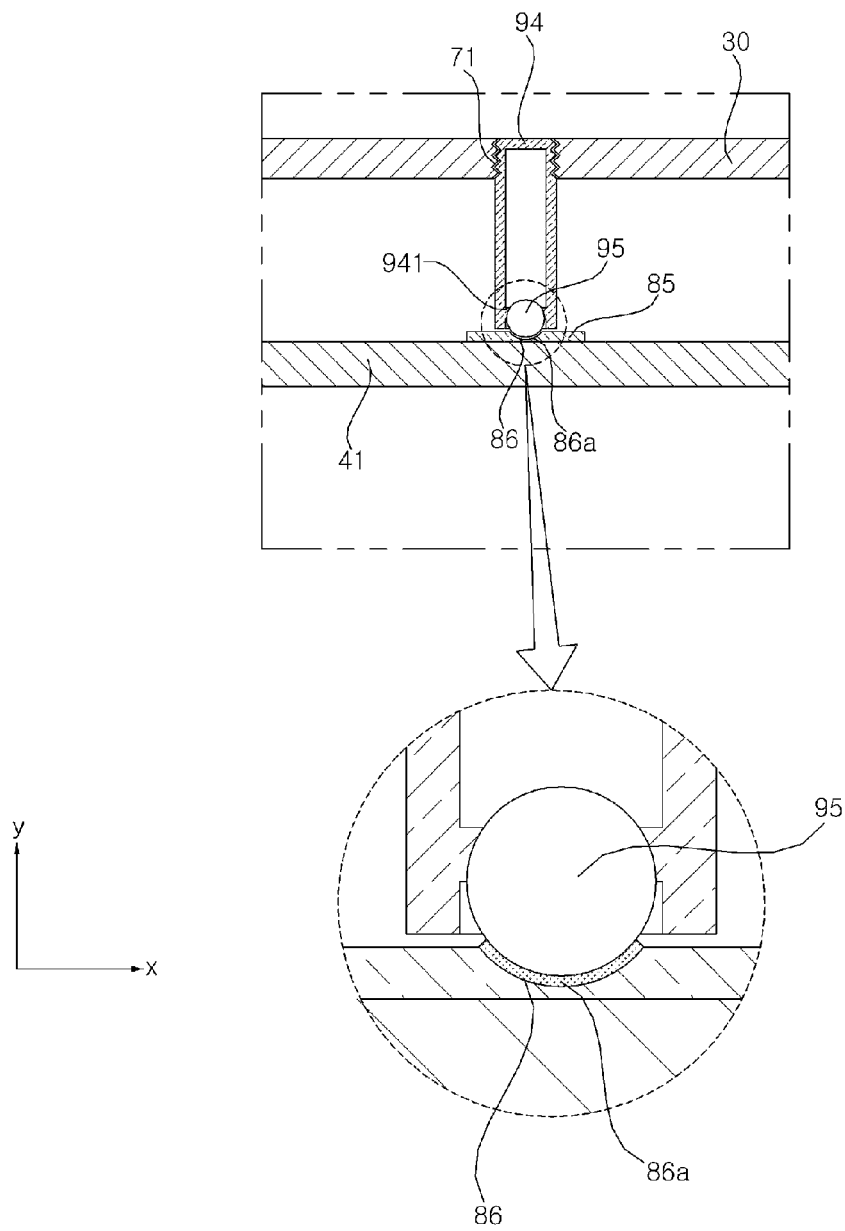

[FIG. 29]
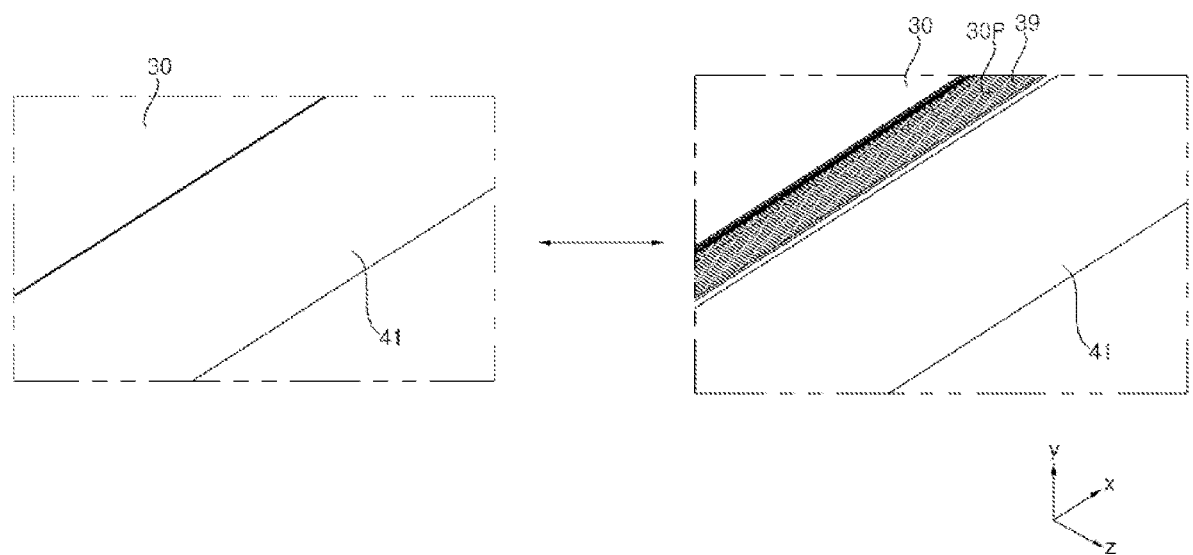

[FIG. 30]
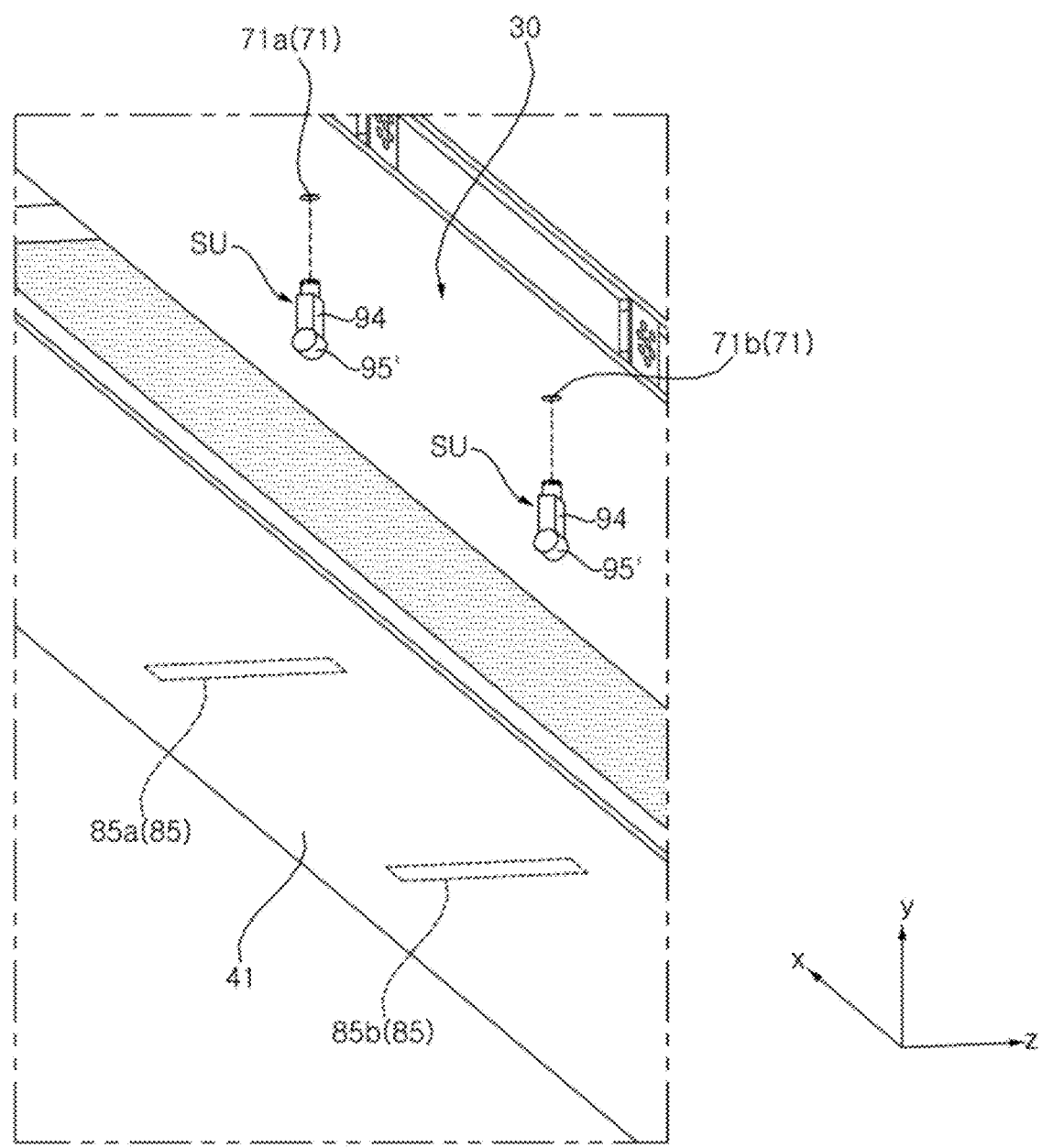

[FIG. 31]
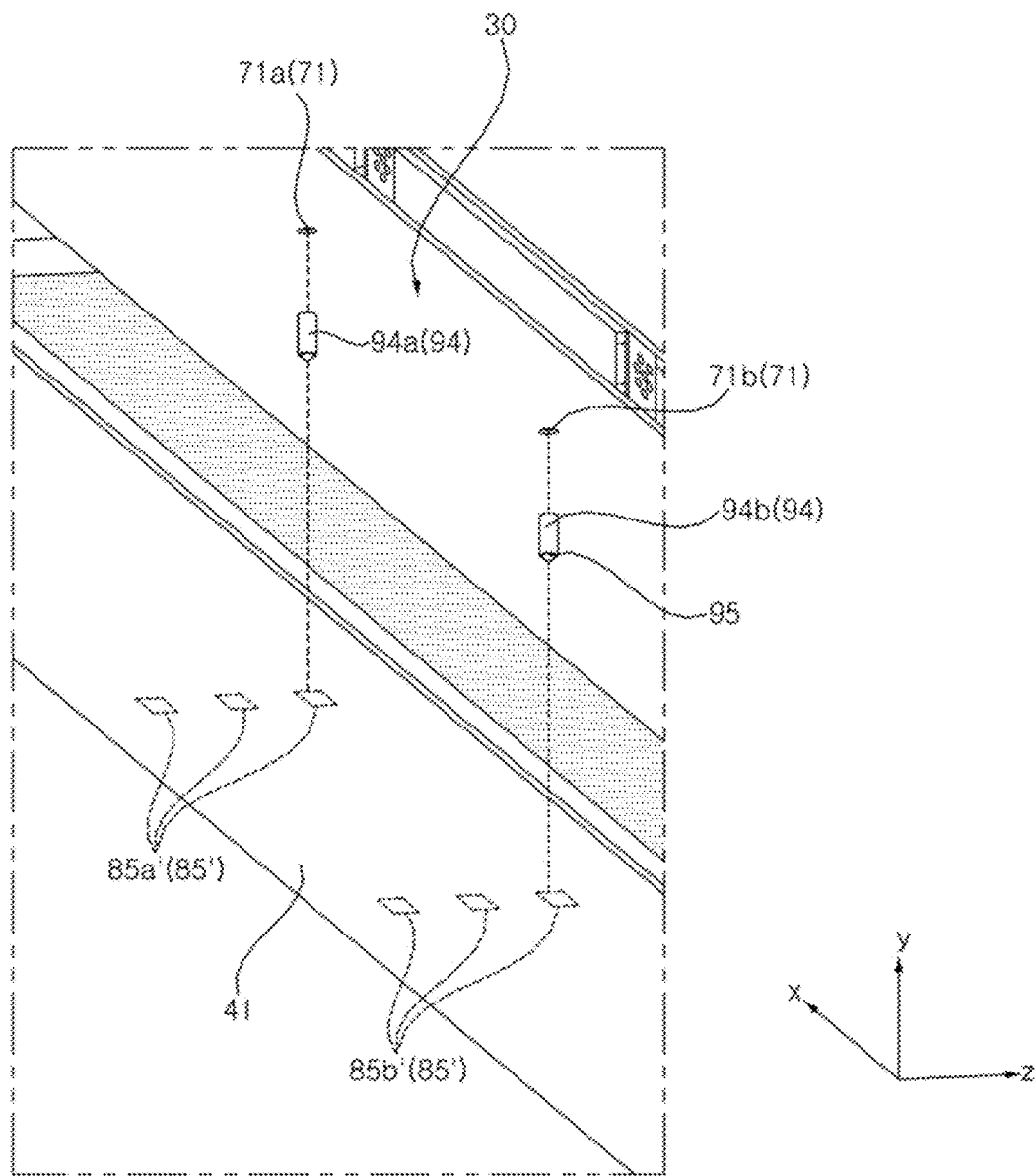

[FIG. 32]
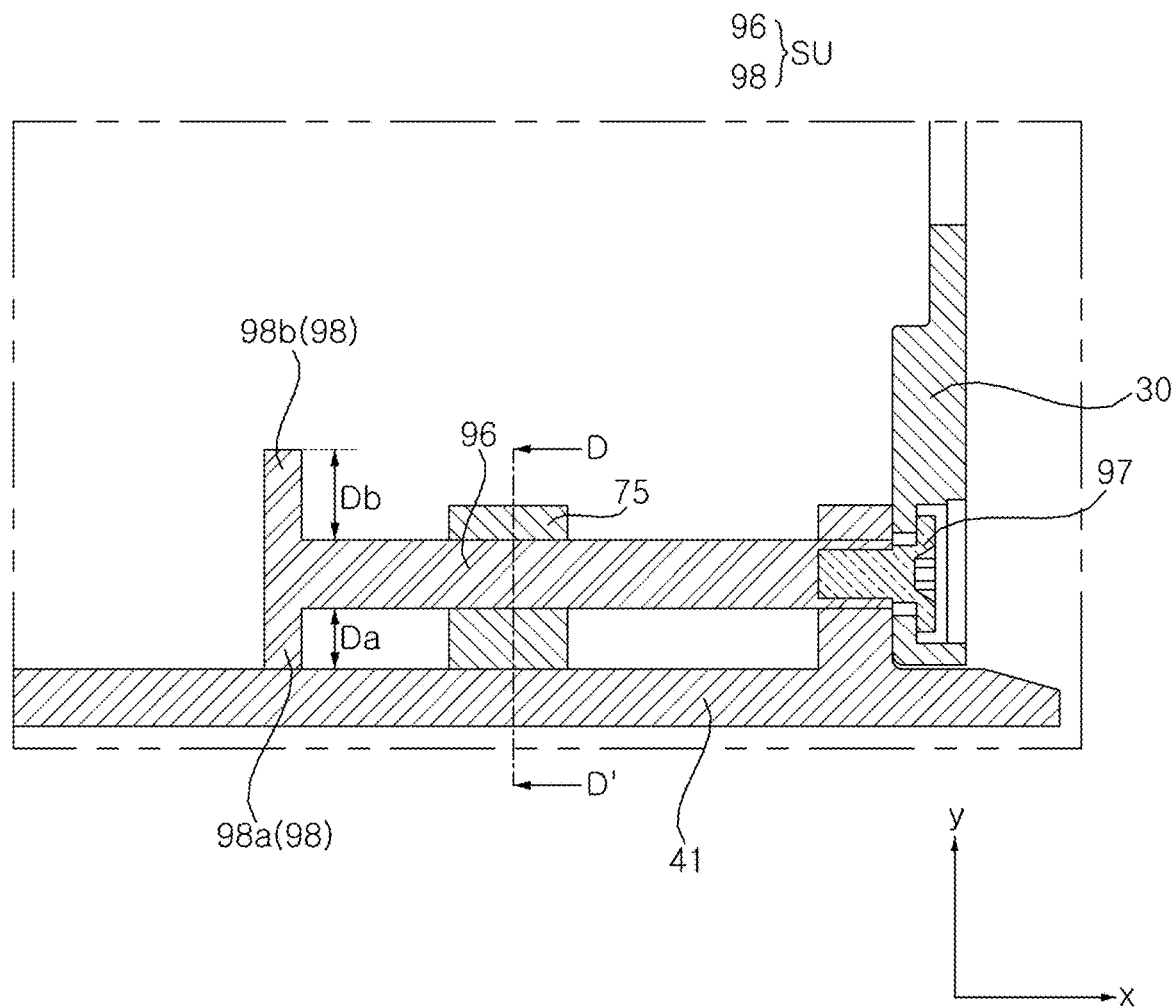

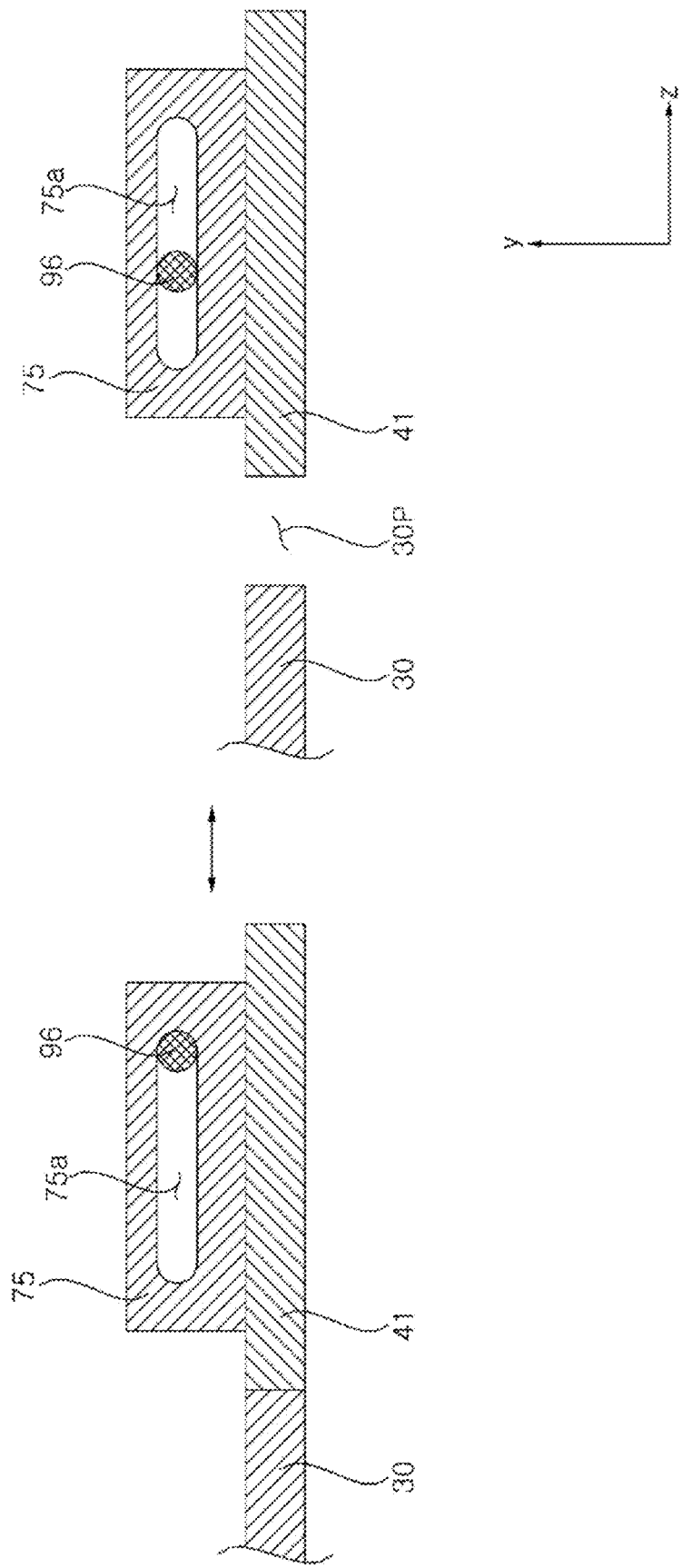

DISPLAY DEVICE

CROSS-REFERENCE TO RELATED APPLICATIONS

This application is the National Stage filing under 35 U.S.C. 371 of International Application No. PCT/KR2020/003014, filed on Mar. 3, 2020, the contents of which are hereby incorporated by reference herein its entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), and Vacuum Fluorescent Display (VFD) have been researched and used in recent years.

Among them, a display device using an organic light emitting diode (OLED) has superior luminance characteristics and viewing angle characteristics compared to a liquid crystal display device, and can be implemented in an ultra-thin shape as it does not require a backlight unit.

In addition, a flexible display panel can be bent or wound on a roller. By using the flexible display panel, it is possible to implement a display device that is roll out from a roller or wound on a roller. A lot of research has been done on a structure for winding or unwinding a flexible display panel on/from a roller.

DISCLOSURE

Technical Problem

An object of the present disclosure is to solve the above and other problems.

Another object of the present disclosure may be to provide a display device capable of preventing sagging of a door that opens and closes an opening through which a display panel passes.

Another object of the present disclosure may be to provide a display device capable of preventing sagging of a door continuously, in addition to duration when the door moves.

Another object of the present disclosure may be to provide a display device capable of preventing a step difference, between a door and a housing adjacent thereto, that is generated according to a sagging of the door.

Technical Solution

According to an aspect of the present disclosure, there is provided a display device including: a flexible display panel; a roller which extends long, and around which the display panel is wound, or from which the display panel is unwound; a housing which has the roller located therein, and has an opening through which the display panel passes; and a door assembly which is coupled to the housing while being adjacent to the opening, and opens and closes the opening; wherein the door assembly includes: a door which opens and closes the opening; and a suspender located between the housing and the door, the suspender that has one end fixed to any one of the housing and the door, and has the other end movably coupled to the other of the housing and the door.

Advantageous Effects

The effect of the display device according to the present disclosure will be described as follows.

According to at least one of embodiments of the present disclosure, it is possible to provide a display device capable of preventing sagging of a door that opens and closes an opening through which a display panel passes.

According to at least one of embodiments of the present disclosure, it is possible to a display device capable of preventing sagging of a door continuously, in addition to duration when the door moves.

According to at least one of embodiments of the present disclosure, it is possible to provide a display device capable of preventing a step difference, between a door and a housing adjacent thereto, that is generated according to a sagging of the door.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

DESCRIPTION OF DRAWINGS

FIGS. 1 to 33 are diagrams illustrating examples of a display device according to embodiments of the present disclosure.

MODE FOR DISCLOSURE

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

A direction parallel to the length direction of the housing 30 may be referred to as a first direction DR1 or a left-right direction LR. A direction parallel to the height direction of the housing 30 may be referred to as a second direction DR2 or an up-down direction UD. A direction perpendicular to the left-right direction LR and the up-down direction UD may be referred to as a third direction DR3 or a front-rear direction FR. A direction in which the display unit 20 displays a screen may be referred to as a forward direction, and a direction opposite to this may be referred to as a rearward direction.

Hereinafter, a display deployment type in which the display unit 20 is deployed while descending from a lower plate of the housing 30 with respect to the display device 100 and is rolled while ascending to the lower plate of the housing 30 will be described as an example, but the display deployment type of the display device 100 applicable to the present disclosure is not limited thereto. That is, a display deployment type in which the display unit 20 is deployed while ascending from an upper plate of the housing 30 with respect to the display device 100 and is rolled while descending to the upper plate of the housing 30 may also be applied to the present disclosure.

Referring to FIG. 2, the entire display unit 20 may be located inside the housing 30. At least a portion of the display unit 20 may be located outside the housing 30. The extent to which the display unit 20 is exposed to the outside of the housing 30 may be adjusted as necessary.

Referring to FIG. 3, the display unit 20 may include a display panel 21 and a plate 23. The display panel 21 may be flexible. For example, the display panel 21 may be an organic light emitting display (OLED).

The display panel 21 may have a front surface for displaying an image. The display panel 21 may have a rear surface opposite to the front surface. The front surface of the display panel 21 may be covered with a light-transmitting material. For example, the light-transmitting material may be a synthetic resin or a film.

The plate 23 may be coupled, fastened, or attached to the rear surface of the display panel 21. The plate 23 may include a metal material. The plate 23 may be referred to as a module cover 23, a cover 23, a display panel cover 23, a panel cover 23, or an apron 23.

Referring to FIG. 4, the plate 23 may include a plurality of segments 23c. A magnet 24 may be located inside a recess 26 of the segment 23c. The recess 26 may be located on a surface of the segment 23c facing the display panel 21. The recess 26 may be located in the front surface of each segment 23c. Since the magnet 24 is received inside the recess 26, the magnet 24 may not protrude out of the segment 23c. The display panel 21 may be flat without being crumpled even when it comes into contact with the segment 23c.

Referring to FIG. 5, a bead 27 may be formed on the upper surface of the segment 23b. The bead 27 may have a shape recessed to the inside of the segment 23b. For example, the bead 27 may be formed by pressing the segment 23b. A plurality of beads 27 may be formed in the segment 23b. The plurality of beads 27 may be spaced apart from each other. The bead 27 may improve the rigidity of the segment 23b. The bead 27 may prevent the shape of the segment 23b from being deformed from an external impact. The segment 23b may be fixed to the rearward direction of the display panel 21 by an adhesive member 22. For example, the adhesive member 22 may be a double-sided tape.

Referring to FIG. 6, a source PCB 21b may be located in the lower side of the module cover 23. When the source PCB 21b is rolled down or rolled up, its position may change with the movement of the module cover 23. A Flexible Flat Cable (FFC) cable 21a may be located in the center of the module cover 23 based on a first direction. The FFC cable 21a may be located in opposite ends of the module cover 23 based on the first direction.

Referring to FIG. 7, the segment 23d may include a recess portion 28 recessed to the inside of the segment 23d. The recess portion 28 may form a space between the display panel 21 and the module cover 23. The FFC cable 21a may be accommodated in the space formed by the recess portion 28. In addition, the recess portion 28 may improve the rigidity of the segment 23d. The bead 27 may be located on the segment 23d excluding a portion where the recess portion 28 is located. The position of the recess portion 28 may not overlap with the position of the bead 27 to prevent the segment 23d from weakening.

Referring to FIG. 8, in the segment 23e, a penetrating portion 29 may be located in a central portion of the segment 23e based on the first direction. The penetrating portion 29 may penetrate the central portion of the segment 23e in the second direction. That is, the penetrating portion 29 may be a hole located in the segment 23e. The penetrating portion 29 may be a portion in which the FFC cable 21a is located. Since the penetrating portion 29 is formed in the segment 23e, the thickness of the segment 23e can be reduced in comparison with a case where the FFC cable 21a is located in the recess portion 28 (refer to FIG. 7). The bead 27 may be located in the segment 23e excluding a portion where the penetrating portion 29 is located. The position of the penetrating portion 29 may not overlap the position of the bead 27 in order to prevent the segment 23e from weakening.

Referring to FIG. 9, a top case 60 may cover the display panel 21 and the module cover 23 as well as the source PCB 21b and an upper bar 201. One surface of the upper bar 201 may be coupled to the rear surface of the module cover 23, and the other surface may be coupled to the source PCB 21b. The upper bar 201 may be fixed to the module cover 23 to support the source PCB 21b.

The lower end of the FFC cable 21a may be connected to a timing controller board 11 (refer to FIG. 10) inside a panel roller 10 (refer to FIG. 10). The FFC cable 21a may be wound around or unwound from the panel roller 10 together with the display unit 20.

A portion of the FFC cable 21a may be located between the display panel 21 and the module cover 23. A portion of the FFC cable 21a located between the display panel 21 and the module cover 23 may be referred to as a first portion 21a1. The first portion 21a1 may be located in the recess portion 28 formed by the plurality of segments 23d. Alternatively, the first portion 21*a*1 may be received in the recess portion 28 formed by the plurality of segments 23*d*.

A portion of the FFC cable 21*a* may penetrate the segment 23*f*. A portion of the FFC cable 21*a* that penetrates the segment 23*f* may be referred to as a second portion 21*a*2. The segment 23*f* may include a first hole 23*fh*1 formed on the front surface and a second hole 23*fh*2 formed on the rear surface. The first hole 23*fh*1 and the second hole 23*fh*2 may be interconnected to form one hole 23*fh*. The hole 23*fh* may penetrate the segment 23*f* in a third direction. The second portion 21*a*2 may pass through the hole 23*fh*. The hole 23*fh* may be referred to as a connection hole 23*fh*.

An upper end of the FFC cable 21*a* may be electrically connected to the source PCB 21*b*. A portion of the FFC cable 21*a* may be located on the rear surface of the module cover 23. A portion of the FFC cable 21*a* located on the rear surface of the module cover 23 may be referred to as a third portion 21*a*3. The third portion 21*a*3 may be electrically connected to the source PCB 21*b*.

The third portion 21*a*3 may be covered by the top case 60. Accordingly, the third portion 21*a*3 may not be exposed to the outside.

Referring to FIG. 10, the FFC cable 21*a* may be connected to the timing controller board 11 mounted on the panel roller 10. A through hole 12 may be formed in the panel roller 10, and the FFC cable 21*a* may be connected to the timing controller board 11 through the through hole 12.

The through hole 12 may be located in one side of the panel roller 10 and may penetrate the outer circumference portion of the panel roller 10. The FFC cable 21*a* may be connected to one side of the timing controller board 11 through the through hole 12.

Even if the FFC cable 21*a* is located on the outer circumference of the panel roller 10, the connection to the timing controller board 11 may be maintained due to the through hole 12. Accordingly, the FFC cable 21*a* may not be twisted by rotating together with the panel roller 10.

A portion of the FFC cable 21*a* may be wound around the panel roller 10. A portion of the FFC cable 21*a* wound around the panel roller 10 may be referred to as a fourth portion 23*a*4. The fourth portion 23*a*4 may be in contact with the circumferential surface of the panel roller 10.

A portion of the FFC cable 21*a* may pass through the through hole 12. A portion of the FFC cable 21*a* passing through the through hole 12 may be referred to as a fifth portion 23*a*5.

A lower end of the FFC cable 21*a* may be electrically connected to the timing controller board 11. A portion of the FFC cable 21*a* may be located inside the panel roller 10. A portion of the FFC cable 21*a* located inside the panel roller 10 may be referred to as a sixth portion 23*a*6. The sixth portion 23*a*6 may be electrically connected to the timing controller board 11.

Referring to FIG. 11, the display panel 21 may be connected to the roller 10. The display panel 21 may be wound around or unwound from the roller 10. The display panel 21 may be electrically connected to the plurality of source PCBs 21*b*. The plurality of source PCBs 21*b* may be spaced apart from each other.

A source chip on film (COF) 21*m* may connect the display panel 21 and the source PCB 21*b*. The source COF 21*m* may be located in the lower side of the display panel 21. The roller 10 may include a first part 13 and a second part 14. The first part 13 and the second part 14 may be fastened by a screw. The timing controller board 11 may be mounted inside the roller 10.

The source PCB 21*b* may be electrically connected to the timing controller board 11. The timing controller board 11 may transmit digital video data and a timing control signal to the source PCB 21*b*.

A cable 21*p* may electrically connect the source PCB 21*b* and the timing controller board 11. For example, the cable 21*p* may be a flexible flat cable (FFC). The cable 21*p* may pass through the hole 21*n*. The hole 21*n* may be formed in a seating portion 15 or in the first part 13. The cable 21*p* may be located between the display panel 21 and the second part 14.

The seating portion 15 may be formed in the outer circumference of the first part 13. The seating portion 15 may be formed by stepping a portion of the outer circumference of the first part 13. The seating portion 15 may form a space B. When the display unit 20 is wound around the panel roller 10, the source PCB 21*b* may be received in the seating portion 15. Since the source PCB 21*b* is received in the seating portion 15, it may not be bent or crooked, and durability may be improved.

Referring to FIGS. 12 and 13, a door assembly 40 may be installed inside the housing 30 while being adjacent to the lower plate of the housing 30. The door assembly 40 may be coupled to the housing 30 while being adjacent to an opening 30P of the lower plate of the housing 30. Here, the opening 30P of the lower plate of the housing 30 may be an opening through which the display panel 21 passes.

A door 41 may cover the opening 30P of the lower plate of the housing 30. The opening 30P of the lower plate of the housing 30 may extend from the lower plate of the housing 30 in a length direction of the housing 30. The door 41 may be a plate that extends long. The door 41 may move while sliding in the front-rear direction of the housing 30. A holder 42 may be coupled to the door 41. One side of the holder 42 may be fixed to the upper surface of the door 41. In this case, the holder 42 may be located adjacent to the right end in the length direction of the door 41. The holder 42 may be referred to as a door holder 42.

The holder 42 may be coupled to a slider 43. The other side of the holder 42 may be fixed to the slider 43. The slider 43 may be movable on a rail 44. The rail 44 may be fixed to the upper side of the lower plate of the housing 30. The rail 44 may include slots 44S extending in the front-rear direction of the housing 30. The slider 43 may be inserted into the slot 44S and may move in the extending direction of the slot 44S. A rack gear 43R may be formed in the upper surface of the slider 43.

A shaft gear 45 may include a first gear 45*a* and a second gear 45*b*. The first gear 45*b* may be engaged with the rack gear 43R, and the second gear 45*a* may be fixed to the first gear 45*b*. For example, the first gear 45*b* and the second gear 45*a* may be formed as one body. A shaft 50 may be inserted into the first gear 45*a* and the second gear 45*b*. The shaft 50, the first gear 45*a*, and the second gear 45*b* may rotate simultaneously.

A motor 49 may provide rotational force. For example, the motor 49 may provide a torque of 4 kg·m. The motor 49 may be installed inside the housing 30. The motor 49 may be connected to a worm 48. When the motor 49 rotates, the worm 48 may rotate. A worm gear 47 may be engaged with the worm 48 connected to the motor 49. The worm gear 47 may be connected to a torque limiter 46. For example, the torque limiter 46 may limit the torque exceeding 2 kg·m. The torque limiter 46 may be connected to the shaft gear 45. For example, the torque limiter 46 may be engaged with the second gear 45*a* of the shaft gear 45.

When the motor 49 rotates, the worm 48 may provide power to the worm gear 47. The worm gear 47 may provide power to the shaft gear 45 through the torque limiter 46. Accordingly, in a situation in which the driving of the door 41 is prevented, a damage to mechanism and an injury due to user's hand being caught can be prevented.

Referring to FIGS. 14 and 15, a first shaft gear 45 may be installed adjacent to the motor 49, and may receive driving force from the motor 49. The first shaft gear 45 may be fixed to a first shaft 50*a* to provide rotational force to the first shaft 50*a*. The first shaft 50*a* may be extend long in the left-right direction of the housing 30, and may be hold by a holder 60H.

A second shaft gear 45' may be installed in the other side opposite to one side of the housing 30 where the motor 49 is located, and be fixed to a second shaft 50*b*. As the second shaft 50*b* rotates, the second shaft gear 45' may be rotated. The first shaft 50*a* and the second shaft 50*b* may be connected or coupled by a joint (no reference numeral) located inside the holder 60H. Meanwhile, the number of shafts 50 may be two or more. When the number of shafts 50 is increased to n, the number of joints may be increased to n−1 correspondingly.

The first shaft gear 45 may move the first slider 43 in the front-rear direction of the housing 30, and the second shaft gear 45' may move a second slider 43' in the front-rear direction of the housing 30 while opening and closing the door 41.

Accordingly, the door 41 may be opened and closed while the shafts 50 rotate without being caught in the holder 60H or causing noise and/or vibration.

Referring to FIG. 16, an example in which the door 41 installed in the lower plate of the housing 30 is opened by rotation of the shaft 50 can be seen. Referring to FIG. 17, an example in which the display unit 20 descends between the opening 30P of the lower plate opened by the movement of the door 41 can be seen.

Referring to FIG. 18, the door 41 may extend in the length direction of the housing 30, that is, in the left-right direction. In addition, one side of the door 41 may be coupled to one side of the housing 30 through the slider 43 and the rail 44 based on the length direction of the door 41, and the other side of the door 41 may be coupled to the other side of the housing 30 through a slider 43' and a rail 44'.

Here, when only both sides of the elongated door 41 are coupled to the housing 30, a portion adjacent to the center of the door 41 may sag downward due to its own weight. In addition, when the door 41 is sagged, a step difference may occur with respect to the housing 30, thereby reducing the sense of unity of a device.

Accordingly, it is necessary to prevent the door 41 from sagging by holding the door 41 at between both sides of the door 41 based on the length direction of the door 41.

Referring to FIGS. 19 and 20, a suspender SU may be located between the housing 30 and the door 41. For example, the suspender SU may be located between the housing 30 and the door 41 based on the up-down direction of the housing 30. The suspender SU may include a plurality of suspenders spaced apart from each other in the length direction of the housing 30. One end of the suspender SU may be fixed to any one of the housing 30 and the door 41. The other end of the suspender SU may be movably coupled to the other one of the housing 30 and the door 41.

The suspender SU may include a pin 90 that extends long. The length direction of the pin 90 may be parallel to the up-down direction of the housing 30. In this case, the door assembly 40 may include a fastening part 71 and a sliding part 80. The fastening part 71 may be formed in any one of the housing 30 and the door 41. The sliding part 80 may be formed in the other one of the housing 30 and the door 41.

One end of the fastening part 71 may be fixed to the pin 90. For example, the pin 90 may be formed in the shape of a long bolt, and the pin 90 may be screwed to the fastening part 71. For example, the fastening part 71 may be formed in a portion of the housing 30 facing the door 41 in the up-down direction.

The sliding part 80 may opposite the fastening part 71 with respect to the pin 90. That is, the pin 90 may be located between the fastening part 71 and the sliding part 80 in the up-down direction. The sliding part 80 may be movably coupled to the other end of the pin 90. For example, the sliding part 80 may be formed in a portion of the door 41 facing the housing 30 in the up-down direction. Thus, the pin 90 that has one end fixed to the fastening part 71 and has a fixed position may slide with respect to the moving door 41.

The sliding part 80 may include a slot SL through which the pin 90 passes, and which extends long in a direction intersecting with the length direction of the pin 90. For example, the length direction of the slot SL may be parallel to a direction in which the door 41 moves, i.e., the front-rear direction of the housing 30.

The sliding part 80 may include a first part 81 and a second part 82. The first part 81 may be formed by penetrating the sliding part 80 in the up-down direction. The second part 82 may protrude from the inner surface of the first part 81, and form a slot SL therein. The first part 81 and the second part 82 may be formed to have a step difference from each other, and may extend in the front-rear direction. The first part 81 and the second part 82 may be formed in a closed-loop shape, thereby preventing the pin 90 inserted into the slot SL based on the front-rear direction from escaping to the outside the slot SL.

The pin 90 may include a body 91, a neck 92, and a head 93. One end of the body 91 may be fixed to the fastening part 71. For example, a thread is formed in one end of the body 91, so that the body 91 may be screwed to the fastening part 71. In this case, the fastening part 71 may be referred to as a screw hole. The neck 92 may be coupled to the other end of the body 91 and inserted into the slot SL. The body 91 and the neck 92 may be formed in a cylindrical shape. For example, the neck 92 may have a larger diameter than the diameter of the body 91. The head 93 may opposite the body 91 with respect to the neck 92. The head 93 may be formed in a shape of screw head. For example, the head 93 may have a larger diameter than a gap of the slot SL.

In this case, the outer surface of the neck 92 may be in contact with the inner surface of the second part 82. That is, when the door 41 moves, the second part 82 may move in the front-rear direction with respect to the neck 92. In other words, when the door 41 moves, the neck 92 may slide along the inner surface of the second part 82.

In addition, the head 93 may overlap with the second part 82 in the length direction of the pin 90. That is, the upper surface of the head 93 may be in contact with the lower surface of the second part 82 to support the second part 82. For example, the second part 82 may be located between the upper end and the lower end of the sliding part 80, and the lower surface of the head 93 may be located in parallel with or in the upper side of the lower surface of the sliding part 80.

In addition, when the door 41 moves, the second part 82 may move in the front-rear direction with respect to the head 93. In other words, when the door 41 moves, the head 93 may slide along the lower surface of the second part 82.

A sheet 82a may be located between the second part 82 and the neck 92. The sheet 82a may be coupled, fastened, or attached to the inner surface of the second part 82. The sheet 82a may include a plastic material. For example, the sheet 82a may include a material such as polycarbonate PC or polyoxymethylen POM.

Accordingly, the sheet 82a may prevent noise from being generated between the sliding operations of the neck 92 with respect to the second part 82.

Referring to FIG. 21, when the door 41 covers all of the opening 30P, the pin 90 may be located adjacent to the inner rear surface of the sliding part 80 based on the front-rear direction of the housing 30. As the door 41 moves in the direction in which the opening 30P is opened, the pin 90 may be closer to the inner front surface of the sliding part 80 based on the front-rear direction of the housing 30. That is, the sliding part 80 is moved in the front-rear direction with respect to the pin 90 inserted into the slot SL, and in response, the opening 30P may be opened or closed or the degree of opening may be adjusted.

In this case, the head 93 may continuously support the second part 82 of the sliding part 80. That is, the door 41 may be movably coupled to the housing 30 by the pin 90, thereby continuously preventing the door 41 from sagging due to its own weight. In addition, the housing 30 and the door 41 share the same amount of sagging through the pin 90, thereby preventing a step difference occurred between the two.

A plurality of pins 90 may be provided, and a plurality of fastening parts 71 and sliding parts 80 may be provided corresponding to the number of pins 90. In this case, the plurality of pins 90 may be located between both sides in the length direction of the door 41, and may be spaced apart from each other. Accordingly, the door 41 may be prevented from sagging at a plurality of points by the plurality of pins 90.

Meanwhile, a brush 39 may be coupled to the housing 30 at a position adjacent to the opening 30P. The brush 39 may include a plurality of comb teeth made of fiber or plastic. The brush 39 may prevent foreign substances such as dust from being flowed into the housing 30 through the opening 30P.

Referring to FIGS. 22 and 23, a sliding part 80' may be formed while being recessed outwardly from the inner surface of the door 41. The sliding part 80' may be spaced apart from the outer surface of the door 41. Here, the inner surface of the door 41 may mean the upper surface of the door 41, the outer surface of the door 41 may mean the lower surface of the door 41, and the outer side of the door 41 may mean the lower side of the door 41.

The sliding part 80' may include a first part 81' and a second part 82'. The first part 81' may be formed while being recessed downward from the door 41. The second part 82' may protrude from the inner surface of the first part 81' and form a slot SL therein. The first part 81' and the second part 82' may be formed to have a step difference from each other.

One end of the body 91 may be fixed to the fastening part 71, and the outer surface of the neck 92 inserted into the slot SL may be in contact with the inner surface of the second part 82'. In this case, a sheet 82a' may be located between the second part 82' and the neck 92. The head 93 may be inserted into a space located between the lower surface of the second part 82' and the lower surface of the door 41. The upper surface of the head 93 may support the lower surface of the second part 82'.

Accordingly, the door 41 may be movably coupled to the housing 30 by the pin 90, thereby continuously preventing the door 41 from sagging due to its own weight. In addition, the head 93 of the pin 90 may not be exposed to the outside through the lower surface of the door 41.

Referring to FIGS. 24 and 25, a fastening part 71" may be formed in a portion of the door 41 facing the housing 30 in the up-down direction. In this case, one end of the pin 90 may be fixed to the fastening part 71". Here, one end of the pin 90 may mean a lower end of the pin 90.

A sliding part 80" may opposite the fastening part 71" with respect to the pin 90. That is, the pin 90 may be located between the fastening part 71" and the sliding part 80" in the up-down direction. The sliding part 80" may be coupled to the other end of the pin 90 to be movable. Here, the other end of the pin 90 may mean an upper end of the pin 90. For example, the sliding part 80" may be formed in a portion of the housing 30 facing the door 41 in the up-down direction.

The sliding part 80" may include a first part 81" and a second part 82". The first part 81" may be formed by penetrating the sliding part 80" in the up-down direction. The second part 82" may protrude from the inner surface of the first part 81" and form a slot SL therein. The first part 81" and the second part 82" are formed to have a step difference from each other, and may extend in the front-rear direction. The first part 81" and the second part 82" may be formed in a closed-loop shape, thereby preventing the pin 90 inserted into the slot SL based on the front-rear direction from escaping to the outside of the slot SL.

One end of the body 91 may be fixed to the fastening part 71, and the outer surface of the neck 92 inserted into the slot SL may be in contact with the inner surface of the second part 82". In this case, a sheet 82a" may be located between the second part 82" and the neck 92. The head 93 may overlap with the second part 82" in the length direction of the pin 90. That is, the upper surface of the second part 82" may be in contact with the lower surface of the head 93 to support the lower surface of the head 93.

Referring to FIGS. 25 and 26, the pin 90 having one end fixed to the fastening part 71" may move together with the door 41 while sliding with respect to the sliding part 80". At this time, the lower surface of the head 93 may be continuously supported by the second part 82", thereby continuously preventing the door 41 to which the pin 90 is fixed from sagging due to its own weight. In addition, the housing 30 and the door 41 share the same amount of sagging through the pin 90, thereby preventing a step difference generated between the two.

In addition, the fastening part 71" may be formed by penetrating the door 41 in the up-down direction. In this case, one end of the body 91 may be exposed to the outside through the lower surface of the door 41. Meanwhile, the fastening part 71" may be formed while being recessed outwardly or downwardly from the inner surface or upper surface of the door 41. In this case, one end of the body 91 may not be exposed to the outside through the lower surface of the door 41.

Referring to FIGS. 27 and 28, the suspender SU may include a pin 94 that has one end fixed to the fastening part 71 and the other end having a magnet 95. The pin 94 may extend long in the up-down direction of the housing 30, and may be formed in a cylindrical shape as a whole. Here, the fastening part 71 may be formed in the housing 30, and the sliding part 80 may be formed in the door 41.

The sliding part 80 may include a magnetic substance 85 facing the magnet 95 in the length direction of the pin 94. Accordingly, a magnetic attraction may act between the magnet 95 and the magnetic substance 85.

Alternatively, a magnet may be provided in the sliding part 80, and a magnetic substance may be provided in the pin 94. In addition, a magnet may be provided in each of the pin 94 and the sliding part 80, and different types of poles (N pole-S pole) may be disposed in a surface on which the magnet provided in the pin 94 and the magnet provided in the sliding part 80 face each other. Meanwhile, the magnet may be provided as an electromagnet. Thus, magnetic attraction may act between the pin 94 and the sliding part 80 through various combinations of magnets or magnetic substances, but for a brief description, a case in which the magnet 95 is provided in the other end of the pin 94 and the magnetic substance 85 is provided in the sliding part 80 will be described.

The magnet 95 may be formed in a ball shape. A shaft 941 may protrude from the inner surface of the pin 94 and be coupled to the magnet 95. In this case, while the magnet 95 is moved on the magnetic substance 85, the magnet 95 may be rotated about the shaft 941.

The magnetic substance 85 may be provided in the inner surface or upper surface of the door 41. The magnetic substance 85 may be coupled, fastened, or attached to the door 41, or may be provided to the door 41 as one body. The magnetic substance 85 may include iron Fe.

The magnetic substance 85 may extend as much as the door 41 moves while opening and closing the opening 30P. The magnetic substance 85 may be formed in an elongated plate shape. The magnetic substance 85 may be recessed from the upper surface to the lower side to form a groove 86 for guiding the movement of the magnet 95. That is, the magnet 95 may slide while being in contact with the groove 86.

A sheet 86a may be located between the magnet 95 and the groove 86. The sheet 86a may be coupled, fastened, or attached to the groove 86. The sheet 86a may include a plastic material. For example, the sheet 86a may include a material such as polycarbonate (PC) or polyoxymethylen (POM).

Accordingly, the sheet 86a may prevent noise from being generated between the sliding operations of the magnet 95 with respect to the groove 86.

Referring to FIGS. 28 and 29, when the door 41 moves, the groove 86 may move in the front-rear direction with respect to the magnet 95. In other words, when the door 41 moves, the magnet 95 may slide along the groove 86 while maintaining magnetic coupling with the groove 86.

That is, the door 41 is movably coupled to the housing 30 by the pin 94, thereby continuously preventing the door 41 from sagging due to its own weight. In addition, the housing 30 and the door 41 share the same amount of sagging through the pin 90, thereby preventing a step difference generated between the two.

Referring to FIG. 30, a magnet 95' may be formed in the shape of a roller, i.e., an elongated cylinder. In this case, in comparison with a case of being formed in a ball shape, a contact area between the magnet 95' and the magnetic substance 85 is increased, so that the magnetic coupling between the magnet 95' and the groove 86 can be more stably implemented.

Referring to FIG. 31, a magnetic substance 85' may be located to correspond to a portion of the movement trajectory of the door 41 facing the magnet 95. For example, in related to opening and closing of the opening 30P, the door 41 may be located in a first position for completely closing the opening 30P, a second position for completely opening the opening 30P, and a third position for closing a part of the opening 30P.

In this case, the magnetic substance 85' may be located in a first point, a second point, and a third point on the door 41. Here, the first point may be located in a rearward direction than the second point and the third point, the second point may be located in a forward direction than the first point and the third point, and the third point may be located between the first point and the second point. When the door 41 is located in the first position, a magnetic substance 851' located in the first position may face the magnet 95. When the door 41 is located in the second position, a magnetic substance 852' located in the second position may face the magnet 95. When the door 41 is located in the third position, a magnetic substance 853' located in the third position may face the magnet 95.

Accordingly, magnetic coupling between the magnet 95 and the magnetic substance 85' is formed at a certain position such as the first to third positions to prevent the door 41 from sagging due to its own weight. In addition, while the door 41 is moving, a contact due to the magnetic coupling between the magnet 95 and the magnetic substance 85' is not accomplished, thereby preventing noise caused by the contact between the two.

Meanwhile, in order to prevent noise due to contact due to magnetic coupling between the magnet 95 and the magnetic substance 85' at a certain position such as the first to third positions, a pad (not shown) formed of a material such as rubber, and silicone may be located on the magnetic substance 85'.

Referring to FIGS. 32 and 33, the suspender SU may include a rod 96 that has one end fixed to the housing 30 and extends long in the length direction of the door 41. For example, one end of the rod 96 may be fixed to a left plate or right plate of the housing 30 through a fastening member 97 such as a screw.

In this case, the door assembly 40 may include a holder 75 that is coupled to the door 41 and has a hole 75a into which the rod 96 is inserted. A portion of the outer surface of the rod 96 may be in contact with the inner surface of the holder 75 defining the hole 75a. The hole 75a may extend long in the moving direction of the door 41, i.e., in the front-rear direction. Thus, when the door 41 moves, the holder 75 may move in the front-rear direction with respect to the rod 96 having one end fixed to the housing 30. In other words, when the door 41 moves, the rod 96 may slide along the inner surface of the holder 75 defining the hole 75a.

That is, the door 41 is movably coupled to the housing 30 by the rod 96, thereby continuously preventing the door 41 from sagging due to its own weight. In addition, the housing 30 and the door 41 share the same amount of sagging through the rod 96, thereby preventing a step difference generated between the two.

Meanwhile, the suspender SU may include a cam 98 that is coupled to the other end of the rod 96 and is rotatable together with the rod 96, and extends in the radial direction of the rod 96 to be in contact with the door 41. In this case, the rod 96 and the cam 98 may be rotated in response to the rotation of the fastening member 97.

The cam 98 may include a first cam 98a extending from the rod 96 by a first length Da and a second cam 98b extending from the rod 96 by a second length Db. Here, the second length Db may be longer than the first length Da. In this case, in response to the rotation of the fastening member 97, the first cam 98a or the second cam 98b may be in contact with the door 41, thereby adjusting the position of the door 41 with respect to the housing 30.

According to an aspect of the present disclosure, provided is a display device including: a flexible display panel; a roller which extends long, and around which the display panel is wound, or from which the display panel is unwound; a housing which has the roller located therein, and has an opening through which the display panel passes; and a door assembly which is coupled to the housing while being adjacent to the opening, and opens and closes the opening; wherein the door assembly includes: a door which opens and closes the opening; and a suspender located between the housing and the door, the suspender that has one end fixed to any one of the housing and the door, and has the other end movably coupled to the other of the housing and the door.

In addition, according to another aspect of the present disclosure, the suspender may further include a pin that extends long, wherein the door assembly may further include: a fastening part to which one end of the pin is fixed; and a sliding part which opposites the fastening part with respect to the pin, and to which the other end of the pin is movably coupled, and wherein the fastening part may be formed at any one of the housing and the door, and the sliding part may be formed at the other of the housing and the door.

In addition, according to another aspect of the present disclosure, the sliding part may further include a slot through which the pin passes, and which extends long in a direction intersecting with a length direction of the pin, wherein the pin may include: a body having one end fixed to the fastening part; a neck which is coupled to the other end of the body, and inserted into the slot; and a head which opposites the body with respect to the neck, and has a diameter greater than a gap of the slot.

In addition, according to another aspect of the present disclosure, the sliding part may include: a first part formed by penetrating the sliding part; and a second part which protrudes from an inner surface of the first part, and forms the slot therein; wherein an outer surface of the neck may be in contact with an inner surface of the second part, and the head may overlap with the second part in a length direction of the pin.

In addition, according to another aspect of the present disclosure, the display device may further include a sheet which is located between the second part and the neck, and formed of a plastic material.

In addition, according to another aspect of the present disclosure, any one of the fastening part and the sliding part may be formed while being recessed outwardly from an inner surface of the door.

In addition, according to another aspect of the present disclosure, the pin and the sliding part may be applied with a mutual magnetic attraction.

In addition, according to another aspect of the present disclosure, the pin may further include a magnet located in the other end of the pin, wherein the sliding part further may include a magnetic substance facing the magnet in a length direction of the pin.

In addition, according to another aspect of the present disclosure, the magnetic substance may extend as much as the door moves while opening and closing the opening.

In addition, according to another aspect of the present disclosure, the magnetic substance may be located to correspond to a portion of a movement trajectory of the door facing the magnet.

In addition, according to another aspect of the present disclosure, the magnet may be formed in a ball or roller shape.

In addition, according to another aspect of the present disclosure, the display device may further include a sheet which is located between the magnet and the magnetic substance, and formed of a plastic material.

In addition, according to another aspect of the present disclosure, the opening and the door may extend long in a length direction of the roller, wherein the suspender may further include a rod that has one end fixed to the housing, and extends long in a length direction of the door.

In addition, according to another aspect of the present disclosure, the door assembly may further include a holder which is coupled to the door, and in which a hole into which the rod is inserted is formed, wherein the hole may extend long in a moving direction of the door.

In addition, according to another aspect of the present disclosure, the suspender may further include a cam which is coupled to the other end of the rod and is rotatable together with the rod, and extends in a radial direction of the rod to contact the door, wherein the cam may include: a first cam extending from the rod by a first length; and a second cam extending from the rod by a second length greater than the first length.

In addition, according to another aspect of the present disclosure, the suspender may further include a plurality of suspenders spaced apart from each other in a length direction of the roller.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible display panel;
   a roller around which the flexible display panel is wound, or from which the flexible display panel is unwound;
   a housing which has the roller located therein, and has an opening through which the flexible display panel passes; and
   a door assembly which is coupled to the housing while being adjacent to the opening, and opens and closes the opening,
   wherein the door assembly comprises:
      a door which opens and closes the opening;
      a suspender comprising a pin and located between the housing and the door, the suspender having one end fixed to any one of the housing and the door, and having another end movably coupled to the other of the housing and the door, a fastening part which is formed at any one of the housing and the door, and to which one end of the pin is fixed; and a sliding part which is formed at the other of the housing and the door, and which is positioned opposite the fastening part with respect to the pin, and to which another end of the pin is movably coupled, wherein the sliding part comprises:

a first part formed by penetrating the sliding part; and a second part protruding from an inner surface of the first part, and forming a slot through which the pin passes, wherein the slot extends in a direction intersecting with a length direction of the pin, wherein the pin comprises:

a body having one end fixed to the fastening part; and a neck which is coupled to the other end of the body, and inserted into the slot, wherein an outer surface of the neck is in contact with an inner surface of the second part, and wherein the display device further comprises a sheet which is located between the second part and the neck, and formed of a plastic material.

2. The display device of claim 1, wherein the pin further comprises:

a head which is opposite to the body with respect to the neck, and which has a diameter greater than a gap of the slot.

3. The display device of claim 2, wherein the head overlaps with the second part in a length direction of the pin.

4. The display device of claim 1, wherein any one of the fastening part and the sliding part is formed while being recessed outwardly from an inner surface of the door.

5. A display device comprising:

a flexible display panel;

a roller around which the flexible display panel is wound, or from which the flexible display panel is unwound;

a housing which has the roller located therein, and has an opening through which the flexible display panel passes; and a door assembly which is coupled to the housing while being adjacent to the opening, and opens and closes the opening;

wherein the door assembly comprises:

a door which opens and closes the opening; and a suspender comprising a pin and located between the housing and the door, the suspender having one end fixed to any one of the housing and the door, and having another end movably coupled to the other of the housing and the door;

a fastening part which is formed at any one of the housing and the door, and to which one end of the pin is fixed; and a sliding part which is formed at the other of the housing and the door, and which is positioned opposite the fastening part with respect to the pin, and to which the other end of the pin is movably coupled, and which comprises a magnetic substance, wherein the pin comprises a magnet located at the other end of the pin, which faces the magnetic substance in a length direction of the pin, and which is formed in a ball or roller shape, and wherein the pin and the sliding part are applied with a mutual magnetic attraction.

6. The display device of claim 5, wherein the magnetic substance extends as much as the door moves while opening and closing the opening.

7. The display device of claim 5, wherein the magnetic substance is located to correspond to a portion of a movement trajectory of the door facing the magnet.

8. The display device of claim 5, further comprising a sheet which is located between the magnet and the magnetic substance, and formed of a plastic material.

9. A display device comprising:

a flexible display panel;

a roller around which the flexible display panel is wound, or from which the flexible display panel is unwound;

a housing which has the roller located therein, and has an opening through which the flexible display panel passes; and a door assembly which is coupled to the housing while being adjacent to the opening, and opens and closes the opening;

wherein the opening extends in a length direction of the roller, wherein the door assembly comprises:

a door which opens and closes the opening, and which extends in a length direction of the roller;

a suspender located between the housing and the door, the suspender having one end fixed to any one of the housing and the door, and having another end movably coupled to the other of the housing and the door, and the suspender comprises a rod that has one end fixed to the housing, and extends in a length direction of the door; and a holder which is coupled to the door, and in which a hole into which the rod is inserted is formed, wherein the hole extends in a moving direction of the door, wherein the suspender further comprises a cam which is coupled to the other end of the rod and is rotatable together with the rod, and extends in a radial direction of the rod to contact the door, and wherein the cam comprises:

a first cam extending from the rod by a first length; and a second cam extending from the rod by a second length greater than the first length.

10. The display device of claim 1, wherein the suspender further comprises a plurality of suspenders spaced apart from each other in a length direction of the roller.

* * * * *